(12) United States Patent
Hattori et al.

(10) Patent No.: US 12,100,531 B2
(45) Date of Patent: Sep. 24, 2024

(54) CONNECTION STRUCTURE FOR SUPERCONDUCTING LAYER, SUPERCONDUCTING WIRE, SUPERCONDUCTING COIL, AND SUPERCONDUCTING DEVICE

(71) Applicant: KABUSHIKI KAISHA TOSHIBA, Tokyo (JP)

(72) Inventors: Yasushi Hattori, Kawasaki (JP); Tomoko Eguchi, Yokohama (JP); Masaya Hagiwara, Yokohama (JP); Keiko Albessard, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 222 days.

(21) Appl. No.: 17/929,409

(22) Filed: Sep. 2, 2022

(65) Prior Publication Data
US 2023/0268099 A1    Aug. 24, 2023

(30) Foreign Application Priority Data

Feb. 24, 2022   (JP) .................................. 2022-026508

(51) Int. Cl.
H01B 12/00 (2006.01)
H01B 12/08 (2006.01)
H01F 6/06 (2006.01)

(52) U.S. Cl.
CPC ............. *H01B 12/08* (2013.01); *H01F 6/06* (2013.01)

(58) Field of Classification Search
CPC ........ H01B 12/06; H01B 12/00; H01B 12/08; H01F 6/06
See application file for complete search history.

(56) References Cited

U.S. PATENT DOCUMENTS

| 2018/0025812 A1 | 1/2018 | Ohki et al. |
| 2018/0204658 A1 | 7/2018 | Osabe et al. |
| 2022/0199887 A1 | 6/2022 | Hagiwara et al. |
| 2022/0302609 A1 | 9/2022 | Hattori et al. |

(Continued)

FOREIGN PATENT DOCUMENTS

| JP | 5828299 B2 | 12/2015 |
| JP | 6178779 B2 | 8/2017 |

(Continued)

*Primary Examiner* — Jeremy C Norris
(74) *Attorney, Agent, or Firm* — Oblon, McClelland, Maier & Neustadt, L.L.P.

(57) ABSTRACT

A connection structure for a superconducting layer according to an embodiment includes a first superconducting layer, a second superconducting layer, and a connection layer between the first superconducting layer and the second superconducting layer, the connection layer including crystal particles containing a rare earth element, barium, copper, and oxygen, the crystal particles having a major diameter distribution including a trimodal distribution. The trimodal distribution has first, second, and third distributions in which major diameter become small in this order. The aspect ratios of the crystal particles included in the first distribution and the second distribution include a bimodal distribution. The median value of the major diameters of the crystal particles included in the distribution on a higher aspect ratio side in the bimodal distribution is greater than the median value of the major diameters of the crystal particles included in the distribution on a lower aspect ratio side.

18 Claims, 14 Drawing Sheets

(56) References Cited

U.S. PATENT DOCUMENTS

| | | |
|---|---|---|
| 2023/0030881 A1 | 2/2023 | Hattori et al. |
| 2023/0085118 A1 | 3/2023 | Hagiwara et al. |

FOREIGN PATENT DOCUMENTS

| | | |
|---|---|---|
| JP | 2017-168424 A | 9/2017 |
| JP | 6675590 B2 | 4/2020 |
| JP | 6743653 B2 | 8/2020 |
| JP | 2022-41667 A | 3/2022 |
| JP | 2022-145041 A | 10/2022 |
| JP | 2023-19936 A | 2/2023 |
| JP | 2023-41996 A | 3/2023 |

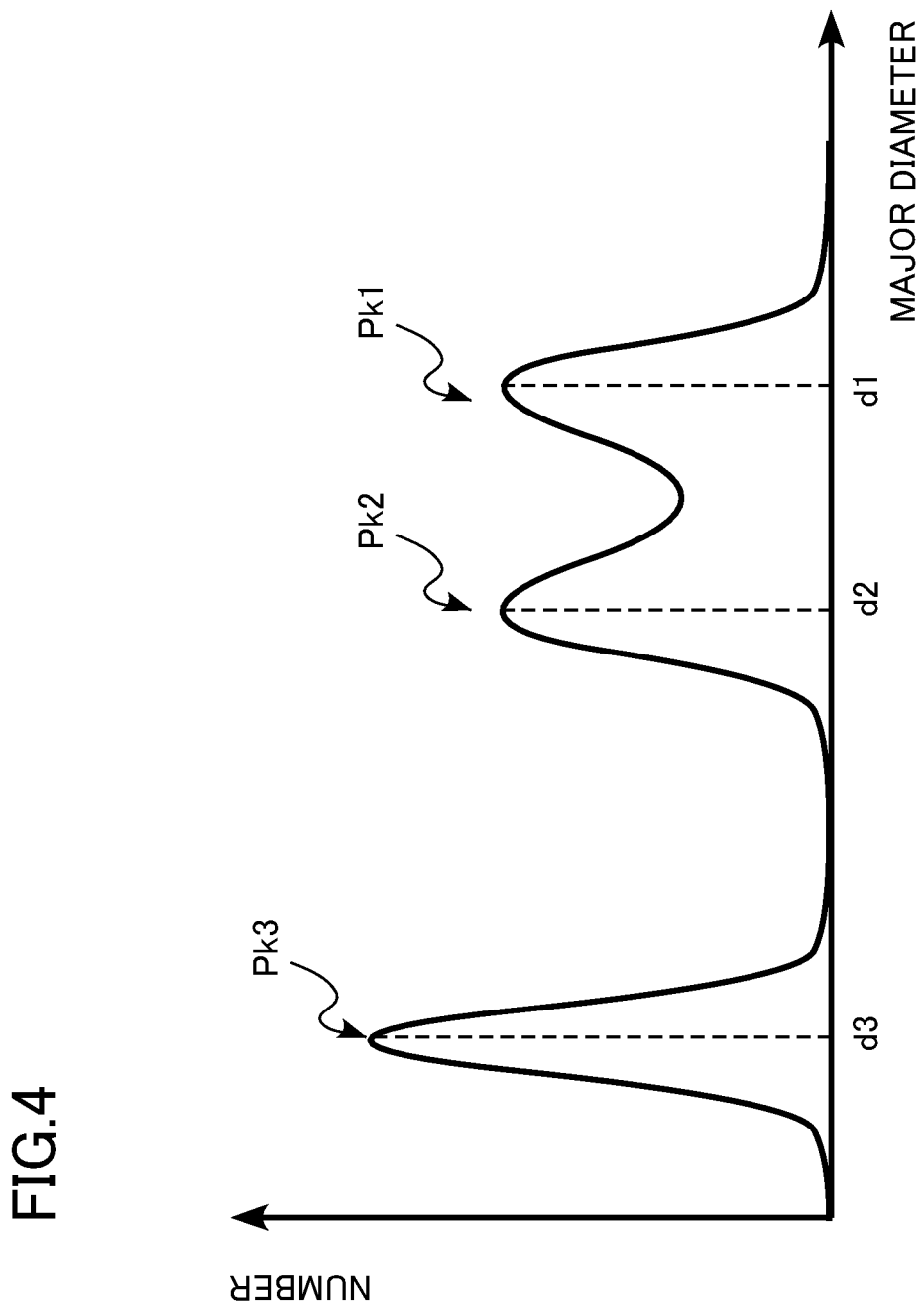

CONNECTION STRUCTURE FOR SUPERCONDUCTING LAYER, SUPERCONDUCTING WIRE, SUPERCONDUCTING COIL, AND SUPERCONDUCTING DEVICE

CROSS-REFERENCE TO RELATED APPLICATION

This application is based upon and claims the benefit of priority from Japanese Patent Application No. 2022-026508, filed on Feb. 24, 2022, the entire contents of which are incorporated herein by reference.

FIELD

Embodiments described herein relate generally to a connection structure for a superconducting layer, a superconducting wire, a superconducting coil, and a superconducting device.

BACKGROUND

A nuclear magnetic resonator (NMR) or a magnetic resonance imaging system (MRI) uses a superconducting coil to generate a strong magnetic field, for example. The superconducting coil is formed by winding a superconducting wire around a spool.

In order to increase the length of the superconducting wire, a plurality of superconducting wires is connected, for example. For example, ends of two superconducting wires are connected using a connection structure. The connection structure for connecting superconducting wires is required to have low electric resistance and high mechanical strength.

BRIEF DESCRIPTION OF THE DRAWINGS

FIG. 4 is a diagram showing a major diameter distribution of crystal particles included in the connection layer in the first embodiment;

DETAILED DESCRIPTION

Figure 1:
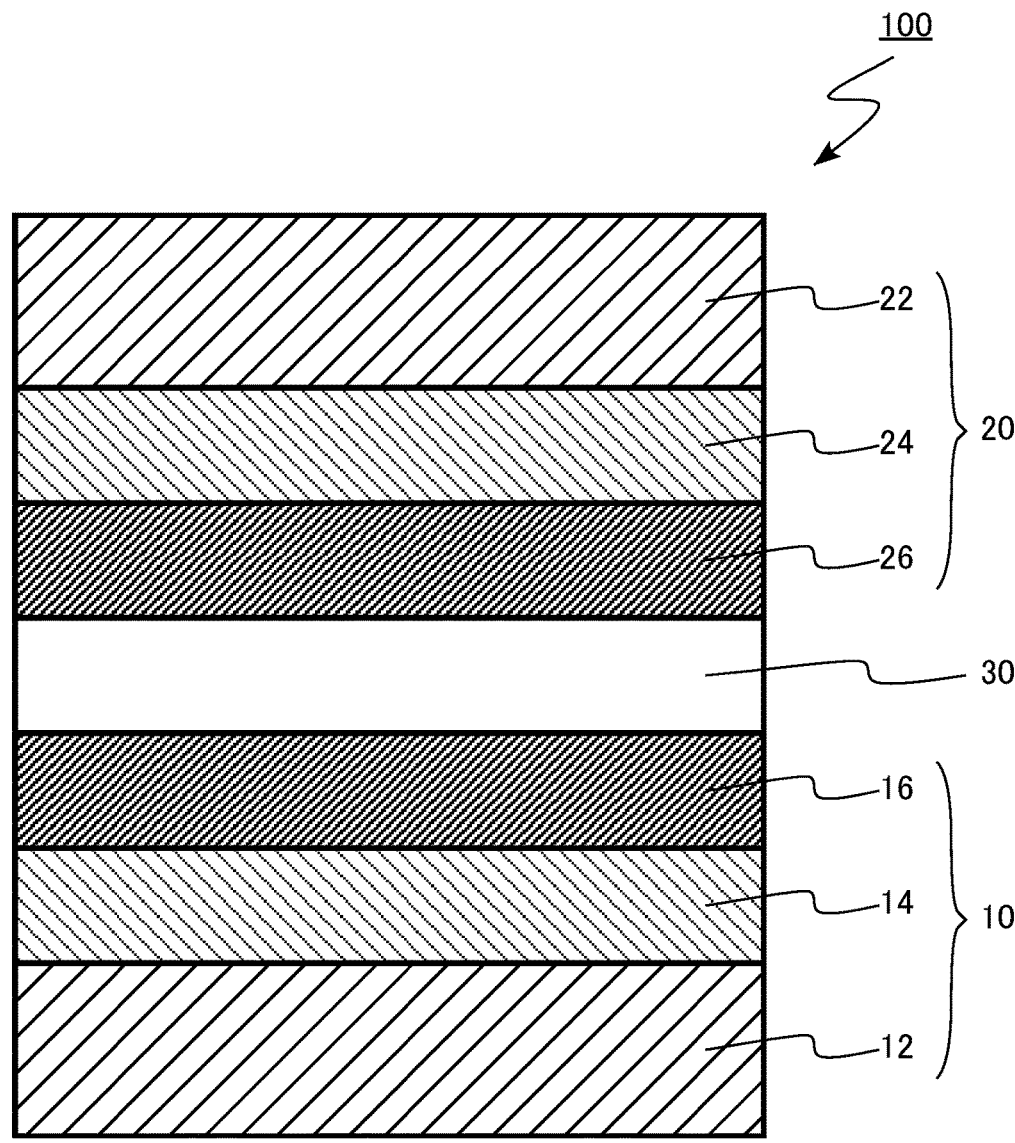
FIG. 1 is a schematic cross-sectional view of a connection structure for a superconducting layer according to a first embodiment.

A connection structure for a superconducting layer according to embodiments includes: a first superconducting layer; a second superconducting layer; and a connection layer provided between the first superconducting layer and the second superconducting layer, the connection layer including crystal particles containing a rare earth element (RE), barium (Ba), copper (Cu), and oxygen (O), the crystal particles having a major diameter distribution including a trimodal distribution, wherein the trimodal distribution includes a first distribution having a first peak, a second distribution having a second peak, and a third distribution having a third peak, a first major diameter corresponding to the first peak is greater than a second major diameter corresponding to the second peak, the second major diameter is greater than a third major diameter corresponding to the third peak, an aspect ratio distribution of the crystal particles included in the first distribution and the second distribution includes a bimodal distribution, and in the bimodal distribution, a first median value of major diameters of the crystal particles included in a distribution on a higher aspect ratio side is greater than a second median value of major diameters of the crystal particles included in a distribution on a lower aspect ratio side.

Embodiments of the present disclosure will be described below with reference to the drawings. In the following description, the same or similar components and the like are denoted by the same reference numerals, and the description of the components and the like once described may be omitted as appropriate.

In the present specification, the major diameter of a particle refers to the maximum length among the lengths between any two points on the outer periphery of the particle. In addition, the minor diameter of a particle refers to a length of a line segment that passes through the midpoint of a line segment corresponding to the major diameter, is perpendicular to the line segment, and has both ends defined on the outer periphery of the particle. The major diameter and the minor diameter of the particle can be obtained by, for example, image analysis of a cross-sectional image by a scanning electron microscope (SEM). In the present specification, a line segment corresponding to the major diameter is referred to as a major axis. A line segment corresponding to the minor diameter is referred to as a minor axis.

The detection of elements contained in particles and the like and the measurement of the atomic concentration of the elements can be performed using, for example, energy dispersive X-ray spectroscopy (EDX) or wavelength dispersive X-ray spectroscopy (WDX). In addition, substances contained in the particles or the like can be identified using, for example, powder X-ray diffractometry.

First Embodiment

A connection structure for a superconducting layer according to the first embodiment includes a first superconducting layer, a second superconducting layer, and a connection layer provided between the first superconducting layer and the second superconducting layer, the connection layer including crystal particles containing a rare earth element (RE), barium (Ba), copper (Cu), and oxygen (O), the crystal particles having a major diameter distribution including a trimodal distribution. The trimodal distribution has a first distribution including a first peak, a second distribution including a second peak, and a third distribution including a third peak, a first major diameter corresponding to the first peak is greater than a second major diameter corresponding to the second peak, and the second major diameter is greater than a third major diameter corresponding to the third peak. An aspect ratio distribution of the crystal particles included in the first distribution and the second distribution includes a bimodal distribution. In the bimodal distribution, a first median value of major diameters of the crystal particles included in a distribution on a higher aspect ratio side is greater than a second median value of major diameters of the crystal particles included in a distribution on a lower aspect ratio side.

FIG. 1 is a schematic cross-sectional view of a connection structure for a superconducting layer according to the first embodiment. A connection structure 100 according to the first embodiment is a structure for physically and electrically connecting two superconducting layers. The connection structure 100 is used, for example, for increasing the length of a superconducting wire by connecting two superconducting wires.

The connection structure 100 includes a first superconducting member 10, a second superconducting member 20, and a connection layer 30. In the connection structure 100, the first superconducting member 10 and the second superconducting member 20 are connected using the connection layer 30. The connection layer 30 is provided between the first superconducting member 10 and the second superconducting member 20.

The first superconducting member 10 includes a first substrate 12, a first intermediate layer 14, and a first superconducting layer 16. The second superconducting member 20 includes a second substrate 22, a second intermediate layer 24, and a second superconducting layer 26.

The first substrate 12 is made of, for example, metal. The first substrate 12 is made of, for example, a nickel alloy or a copper alloy. The first substrate 12 is made of, for example, a nickel tungsten alloy.

The first superconducting layer 16 is, for example, an oxide superconducting layer. The first superconducting layer 16 contains, for example, a rare earth element (RE), barium (Ba), copper (Cu), and oxygen (O). The first superconducting layer 16 contains, for example, at least one rare earth element (RE) selected from the group including yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

The first superconducting layer 16 has a chemical composition represented by, for example, (RE) $Ba_2Cu_3O_\delta$ (RE is a rare earth element, $6 \leq \delta \leq 7$). The first superconducting layer 16 has a chemical composition represented by, for example, $GdBa_2Cu_3O_\delta$ ($6 \leq \delta \leq 7$), $YBa_2Cu_3O_\delta$ ($6 \leq \delta \leq 7$), or $EuBa_2Cu_3O_\delta$ ($6 \leq \delta \leq 7$).

The first superconducting layer 16 includes a single crystal having a perovskite structure, for example.

The first superconducting layer 16 is formed on the first intermediate layer 14 by, for example, a metal organic decomposition method (MOD method), a pulsed laser deposition method (PLD method), or a metal organic chemical vapor deposition method (MOCVD method).

The first intermediate layer 14 is provided between the first substrate 12 and the first superconducting layer 16. The first intermediate layer 14 is in contact with the first superconducting layer 16, for example. The first intermediate layer 14 has a function of improving the crystal orientation of the first superconducting layer 16 formed on the first intermediate layer 14.

The first intermediate layer 14 contains, for example, a rare earth oxide. The first intermediate layer 14 has, for example, a stacked structure of a plurality of films. The first intermediate layer 14 has, for example, a structure in which yttrium oxide ($Y_2O_3$), yttria stabilized zirconia (YSZ), and cerium oxide ($CeO_2$) are stacked from the first substrate 12 side.

The second substrate 22 is made of, for example, metal. The second substrate 22 is made of, for example, a nickel alloy or a copper alloy. The second substrate 22 is made of, for example, a nickel tungsten alloy.

The second superconducting layer 26 is, for example, an oxide superconducting layer. The second superconducting layer 26 contains, for example, a rare earth element (RE), barium (Ba), copper (Cu), and oxygen (O). The second superconducting layer 26 contains, for example, at least one rare earth element (RE) selected from the group including yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

The second superconducting layer 26 has a chemical composition represented by, for example, (RE) $Ba_2Cu_3Ob$ (RE is a rare earth element, $6 \leq \delta \leq 7$). The second superconducting layer 26 has a chemical composition represented by, for example, $GdBa_2Cu_3O_\delta$ ($6 \leq \delta \leq 7$), $YBa_7Cu_3O_\delta$ ($6 \leq \delta \leq 7$), or $EuBa_2Cu_3O_\delta$ ($6 \leq \delta \leq 7$).

The second superconducting layer 26 includes a single crystal having a perovskite structure, for example.

The second superconducting layer 26 is formed on the second intermediate layer 24 by, for example, the MOD method, the PLD method, or the MOCVD method.

The second intermediate layer 24 is provided between the second substrate 22 and the second superconducting layer 26. The second intermediate layer 24 is in contact with the second superconducting layer 26, for example. The second intermediate layer 24 has a function of improving the crystal orientation of the second superconducting layer 26 formed on the second intermediate layer 24.

The second intermediate layer 24 contains, for example, a rare earth oxide. The second intermediate layer 24 has, for example, a stacked structure of a plurality of films. The second intermediate layer 24 has, for example, a structure in which yttrium oxide ($Y_2O_3$), yttria stabilized zirconia (YSZ), and cerium oxide ($CeO_2$) are stacked from the second substrate 22 side.

The connection layer 30 is provided between the first superconducting layer 16 and the second superconducting layer 26. The connection layer 30 is in contact with the first superconducting layer 16. The connection layer 30 is in contact with the second superconducting layer 26.

The connection layer 30 is an oxide superconducting layer. The connection layer 30 contains a rare earth element (RE), barium (Ba), copper (Cu), and oxygen (O). The connection layer 30 contains, for example, at least one rare earth element (RE) selected from the group including yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

Figure 2:
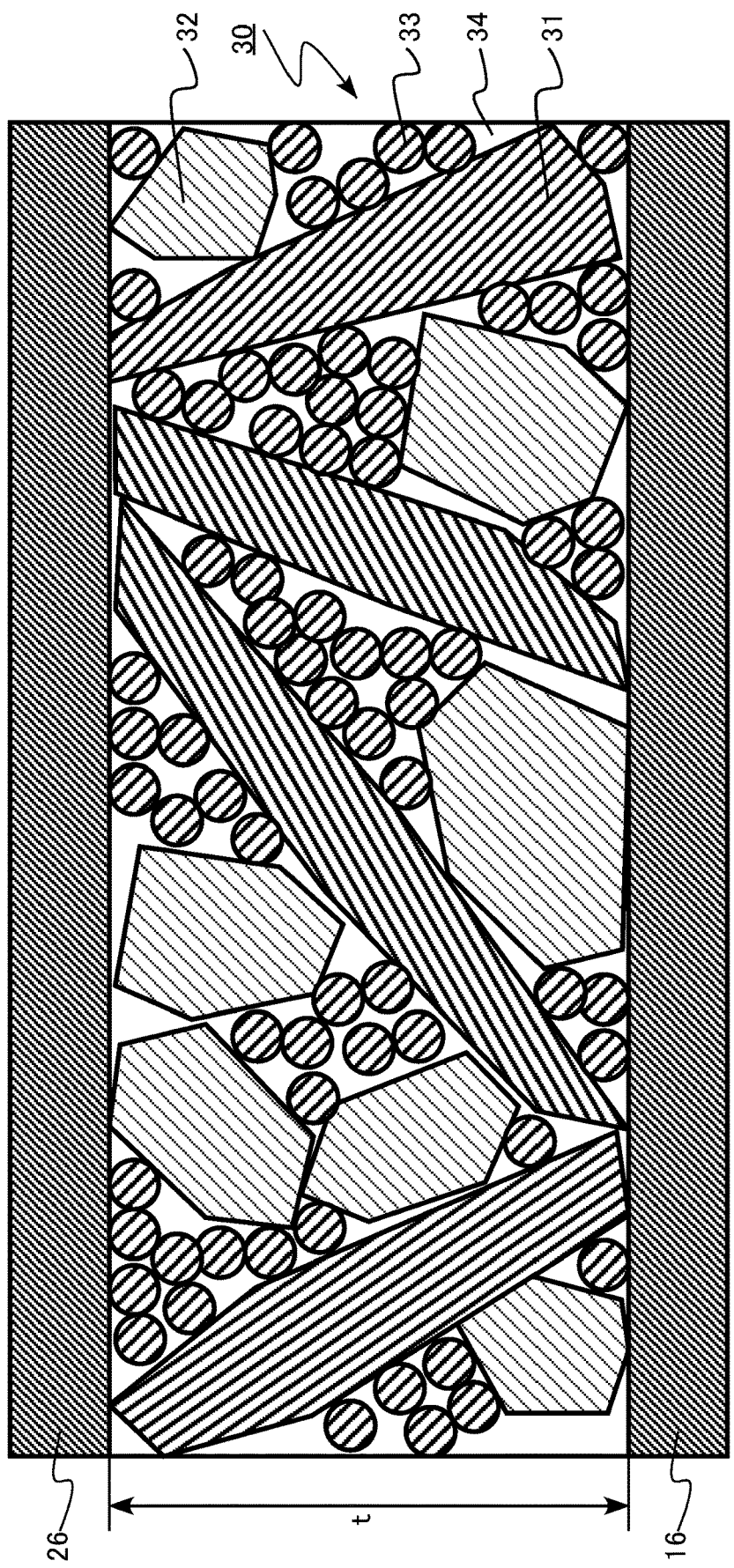
FIG. 2 is an enlarged schematic cross-sectional view of a part of a connection layer in the first embodiment.

FIG. 2 is an enlarged schematic cross-sectional view of a part of the connection layer in the first embodiment.

The connection layer 30 includes a first crystal particle 31, a second crystal particle 32, a third crystal particle 33, and a void 34. The connection layer 30 is formed by sintering the first crystal particle 31, the second crystal particle 32, and the third crystal particle 33.

The first crystal particle 31, the second crystal particle 32, and the third crystal particle 33 are examples of crystal particles.

The connection layer 30 is porous, for example. For example, the void 34 is present between particles included in the connection layer 30. The connection layer may not have the void 34.

The first crystal particle 31 includes a rare earth element (RE), barium (Ba), copper (Cu), and oxygen (O). The first crystal particle 31 is a rare earth oxide. The first crystal particle 31 is, for example, a single crystal or a polycrystal having a perovskite structure.

The first crystal particle 31 has a chemical composition represented by, for example, (RE) $Ba_2Cu_3O_\delta$ (RE is a rare earth element, $6 \leq \delta \leq 7$). The first crystal particle 31 has a chemical composition represented by, for example, $GdBa_2Cu_3O_\delta$ ($6 \leq \delta \leq 7$), $YBa_2Cu_3O_\delta$ ($6 \leq \delta \leq 7$), or $EuBa_2Cu_3O_\delta$ ($6 \leq \delta \leq 7$).

The first crystal particle 31 is a superconductor.

The first crystal particle 31 has, for example, a sheet shape or a flat shape. The first crystal particle 31 are, for example, a sheet-shaped particle or a flat-shaped particle shape. The flat shape means that the aspect ratio of the particle is equal to or more than 2. The aspect ratio of the particle is a ratio of the major diameter to the minor diameter of the particle (major diameter/minor diameter).

The median value of the major diameters of the first crystal particles 31 is, for example, equal to or more than 100 nm and equal to or less than 10 μm. The median value of the major diameters of the first crystal particles 31 is, for example, larger than the thickness (t in FIG. 2) of the connection layer 30 in the direction from the first superconducting layer 16 toward the second superconducting layer 26.

The major axis direction of the first crystal particle 31 is inclined with respect to the interface between the first superconducting layer 16 and the connection layer 30, for example. The angle between the major axis direction of the first crystal particle 31 and the interface between the first superconducting layer 16 and the connection layer 30 is defined as a first inclination angle. The first inclination angle is, for example, equal to or more than 15 degrees and equal to or less than 90 degrees.

The second crystal particle 32 includes a rare earth element (RE), barium (Ba), copper (Cu), and oxygen (O). The second crystal particle 32 is a rare earth oxide. The second crystal particle 32 is a single crystal or a polycrystal having a perovskite structure, for example. The second crystal particle 32 has a chemical composition represented by, for example, (RE) $Ba_2Cu_3O_\delta$ (RE is a rare earth element, $6 \leq \delta \leq 7$).

The second crystal particle 32 is a superconductor.

The second crystal particle 32 contains, for example, the same rare earth element as the first crystal particle 31. The chemical composition of the second crystal particle 32 is the same as the chemical composition of the first crystal particle 31, for example.

The second crystal particle 32 may contain, for example, a rare earth element different from that of the first crystal particle 31. The chemical composition of the second crystal particle 32 may be different from the chemical composition of the first crystal particle 31, for example.

The second crystal particle 32 has, for example, an indefinite shape. The aspect ratio of the second crystal particle 32 is smaller than the aspect ratio of the first crystal particle 31. The aspect ratio of the second crystal particle 32 is, for example, less than 2.

The median value of the major diameters of the second crystal particles 32 is smaller than the major diameter of the first crystal particle 31. The median value of the major diameters of the second crystal particles 32 is, for example, equal to or more than 50 nm and equal to or less than 5 μm. The median value of the major diameters of the second crystal particles 32 is, for example, smaller than the thickness (t in FIG. 2) of the connection layer 30 in the direction from the first superconducting layer 16 toward the second superconducting layer 26.

The third crystal particle 33 includes a rare earth element (RE), barium (Ba), copper (Cu), and oxygen (O). The third crystal particle 33 is a rare earth oxide. The third crystal particle 33 is a single crystal or a polycrystal having a perovskite structure, for example. The third crystal particle 33 has a chemical composition represented by, for example, (RE) $Ba_2Cu_3O_\delta$ (RE is a rare earth element, $6 \leq \delta \leq 7$).

The third crystal particle 33 is, for example, a superconductor.

The third crystal particle 33 contains the same rare earth element as the first crystal particle 31, for example. The chemical composition of the third crystal particle 33 is the same as the chemical composition of the first crystal particle 31, for example.

The third crystal particle 33 may contain, for example, a rare earth element different from that of the first crystal particle 31. The chemical composition of the third crystal particle 33 may be different from the chemical composition of the first crystal particle 31, for example.

The third crystal particle 33 contains the same rare earth element as the second crystal particle 32, for example. The chemical composition of the third crystal particle 33 is the same as the chemical composition of the second crystal particle 32, for example.

The third crystal particle 33 may contain a rare earth element different from that of the second crystal particle 32, for example. The chemical composition of the third crystal particle 33 may be different from the chemical composition of the second crystal particle 32, for example.

The third crystal particle 33 has, for example, a spherical shape or an indefinite shape. The aspect ratio of the third crystal particle 33 is, for example, less than 2.

The median value of the major diameters of the third crystal particles 33 is smaller than the median value of the major diameters of the first crystal particles 31 and the median value of the major diameters of the second crystal particles 32. The median value of the major diameters of the third crystal particles 33 is, for example, equal to or more than 10 nm and less than 1 μm.

The median value of the major diameters of the first crystal particles 31 is, for example, equal to or more than 10 times and equal to or less than 1000 times the median value of the major diameters of the third crystal particles 33. The median value of the major diameters of the second crystal particles 32 is, for example, equal to or more than 10 times and equal to or less than 1000 times the median value of the major diameters of the third crystal particles 33.

Figure 3B:
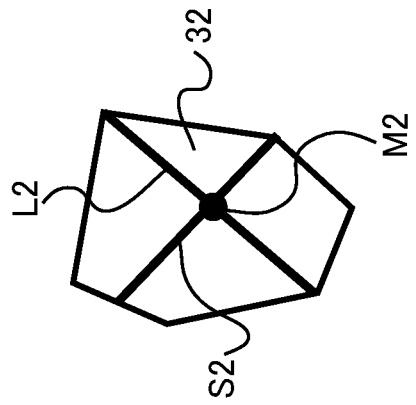
FIGS. 3A and 3B are diagrams showing definitions of a major diameter and a minor diameter of a crystal particle in the first embodiment.
Figure 3A:
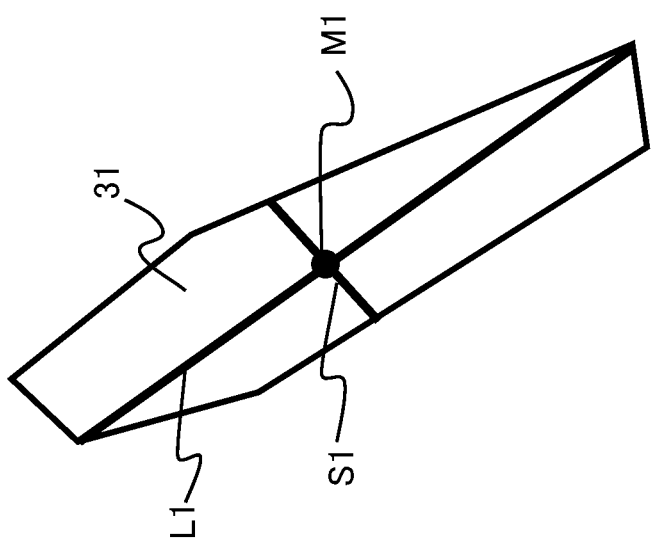

FIGS. 3A and 3B are diagrams showing definitions of the major diameter and the minor diameter of a crystal particle in the first embodiment. FIG. 3A is a diagram of the first crystal particle 31, and FIG. 3B is a diagram of the second crystal particle 32.

The major diameter of a particle refers to the maximum length among the lengths between any two points on the outer periphery of the particle. In addition, the minor diameter of a particle refers to a length of a line segment that passes through the midpoint of a line segment corresponding to the major diameter, is perpendicular to the line segment, and has both ends defined on the outer periphery of the particle.

For example, the major diameter of the first crystal particle 31 shown in FIG. 3A is the length of a line segment L1. The minor diameter of the first crystal particle 31 shown in FIG. 3A is the length of a line segment S1. The line segment S1 passes through a midpoint M1 of the line segment L1. The aspect ratio of the first crystal particle 31 shown in FIG. 3A is L1/S1.

For example, the major diameter of the second crystal particle 32 shown in FIG. 3B is the length of a line segment L2. The minor diameter of the second crystal particle 32 shown in FIG. 3B is the length of a line segment S2. The line segment S2 passes through a midpoint M2 of the line segment L2. The aspect ratio of the second crystal particle 32 shown in FIG. 3B is L2/S2.

FIG. 4 is a diagram showing a major diameter distribution of the crystal particles included in the connection layer in the first embodiment. FIG. 4 shows the distribution of the major diameters of the first crystal particles 31, the second crystal particles 32, and the third crystal particles 33 included in the connection layer 30.

As illustrated in FIG. 4, the major diameter distribution of the crystal particles included in the connection layer 30 includes a trimodal distribution. The trimodal distribution has a first distribution including a first peak (Pk1 in FIG. 4), a second distribution including a second peak (Pk2 in FIG. 4), and a third distribution including a third peak (Pk3 in FIG. 4).

The major diameter distribution of the crystal particles included in the connection layer 30 may be a multimodal distribution having peaks equal to or more than four.

The major diameter corresponding to the first peak Pk1 is a first major diameter (d1 in FIG. 4). The major diameter corresponding to the second peak Pk2 is a second major diameter (d2 in FIG. 4). The major diameter corresponding to the third peak Pk3 is the third major diameter (d3 in FIG. 4).

The first major diameter d1 is greater than the second major diameter d2. The second major diameter d2 is greater than the third major diameter d3. The first major diameter d1 is, for example, equal to or more than 10 times and equal to or less than 1000 times the third major diameter d3. The second major diameter d2 is, for example, equal to or more than 10 times and equal to or less than 1000 times the third major diameter d3.

The first major diameter d1 is, for example, equal to or more than 100 nm and equal to or less than 10 μm. The second major diameter d2 is, for example, equal to or more than 50 nm and equal to or less than 5 μm. The third major diameter d3 is, for example, equal to or more than 10 nm and less than 1 μm.

The crystal particles included in the first distribution are mainly the first crystal particle 31. The crystal particles included in the second distribution are mainly the second crystal particle 32. The crystal particles included in the third distribution are mainly the third crystal particle 33.

Figure 5:
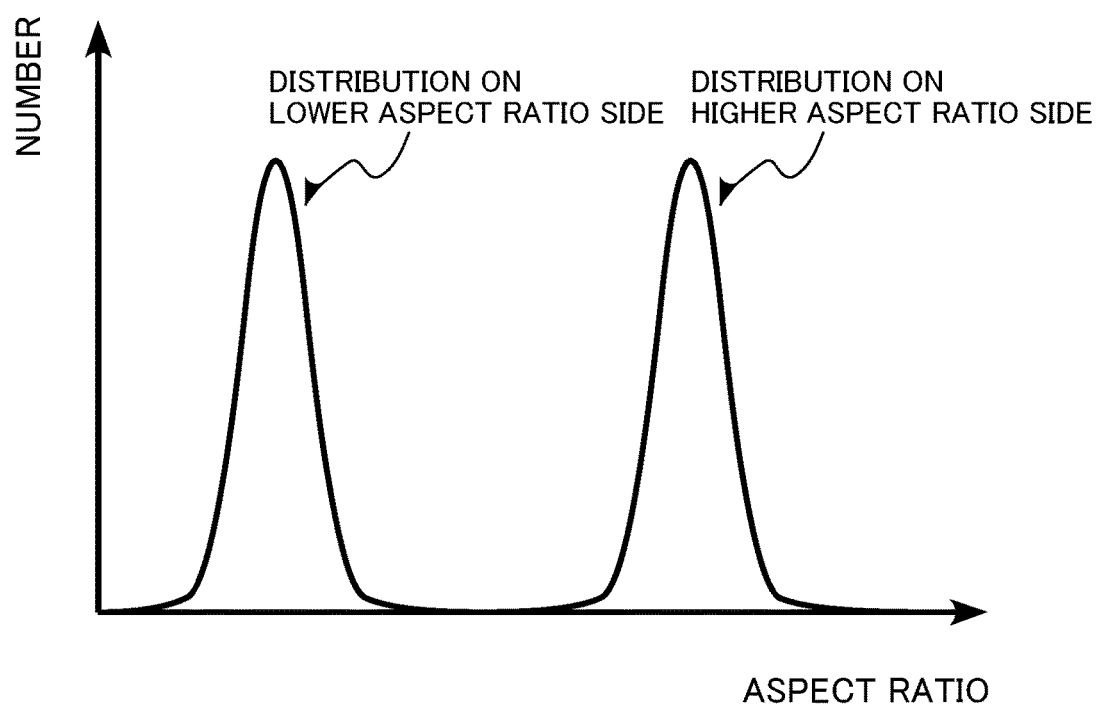
FIG. 5 is a diagram showing an aspect ratio distribution of the crystal particles included in the connection layer in the first embodiment.

FIG. 5 is a diagram showing an aspect ratio distribution of the crystal particles included in the connection layer in the first embodiment. FIG. 5 shows the aspect ratio distribution of the crystal particles included in the first distribution and the second distribution in the major diameter distribution of the crystal particles included in the connection layer 30.

As illustrated in FIG. 5, the aspect ratio distribution of the crystal particles included in the first distribution and the second distribution includes a bimodal distribution.

The aspect ratio distribution of the crystal particles included in the first distribution and the second distribution may be a multimodal distribution having peaks equal to or more than three.

In the bimodal distribution, the crystal particles included in the distribution on the higher aspect ratio side are the first crystal particles 31. In other words, the crystal particles included in the distribution on the higher aspect ratio side shown in FIG. 5 are the first crystal particles 31.

In the bimodal distribution, the crystal particles included in the distribution on the lower aspect ratio side are the second crystal particles 32. In other words, the crystal particles included in the distribution on the lower aspect ratio side shown in FIG. 5 are the second crystal particles 32.

In the bimodal distribution, a first median value of major diameters of the crystal particles included in the distribution on the higher aspect ratio side is greater than a second median value of major diameters of the crystal particles included in the distribution on the lower aspect ratio side. In other words, the first median value of the major diameters of the first crystal particles 31 is greater than the second median value of the major diameters of the second crystal particles 32.

The first median value is greater than the thickness (t in FIG. 2) of the connection layer 30 in the direction from the first superconducting layer 16 toward the second superconducting layer 26, for example. The second median value is smaller than the thickness (t in FIG. 2) of the connection layer 30 in the direction from the first superconducting layer 16 toward the second superconducting layer 26.

In the bimodal distribution, the median value of the aspect ratios of the crystal particles included in the distribution on the higher aspect ratio side is equal to or more than 2, and in the bimodal distribution, the median value of the aspect ratios of the crystal particles included in the distribution on the lower aspect ratio side is less than 2. In other words, the median value of the aspect ratios of the first crystal particles 31 is equal to or more than 2, and the median value of the aspect ratios of the second crystal particles 32 is less than 2.

The number of crystal particles included in the distribution on the higher aspect ratio side in the bimodal distribution is equal to or more than 0.1 times and equal to or less than 1.1 times the number of crystal particles included in the distribution on the lower aspect ratio side in the bimodal distribution. In other words, the number of the first crystal particles 31 is equal to or more than 0.1 times and equal to or less than 1.1 times the number of the second crystal particles 32.

The crystal particles included in the distribution on the higher aspect ratio side in the bimodal distribution include a sheet-shaped crystal particle or a flat-shaped crystal particle. In other words, the first crystal particles 31 include a sheet-shaped crystal particle or a flat-shaped crystal particle.

In a case where an inclination angle between the major axis direction of the crystal particle included in the distribution on the higher aspect ratio side in the bimodal distribution and the interface between the first superconducting layer 16 and the connection layer 30 is defined as a first inclination angle, a median value of the first inclination angles is, for example, equal to or more than 15 degrees and equal to or less than 90 degrees. In other words, the median value of the first inclination angles between the major axis directions of the first crystal particles 31 and the interface between the first superconducting layer 16 and the connection layer 30 is equal to or more than 15 degrees and equal to or less than 90 degrees.

The crystal particles included in the distribution on the lower aspect ratio side in the bimodal distribution include a crystal particle having an indefinite shape. In other words, the second crystal particles 32 include a particle with an indefinite shape.

Next, an example of a method for manufacturing the connection structure for a superconducting layer according to the first embodiment will be described.

First, an oxide superconductor containing a rare earth element (RE), barium (Ba), copper (Cu), and oxygen (O) is formed.

The oxide superconductor is formed by, for example, a solid phase reaction method. During the formation of the oxide superconductor, powders of $Gd_2O_3$, $BaCO_3$, and CuO are mixed and compressed to prepare a green compact. The green compact is sintered, by which an oxide superconductor having a composition of $GdBa_2Cu_3O_\delta$ ($6 \leq \delta \leq 7$) is formed.

The oxide superconductor is pulverized, by which the first crystal particles 31 having an aspect ratio equal to or more than 2 are formed. In addition, by pulverizing the oxide superconductor, the second crystal particles 32 having an aspect ratio of less than 2 and having a major diameter smaller than that of the first crystal particles 31 are formed. For example, crystal particles having different aspect ratios and different major diameters can be formed by changing the degree and method of pulverization.

Next, the connection layer 30 is formed using, for example, the MOD method.

An organometallic salt solution is prepared using powders of $Gd(OCOCH_3)_2$, $Ba(OCOCH_3)_2$, and $Cu(OCOCH_3)_2$. The first crystal particles 31 and the second crystal particles 32 are mixed with the prepared organometallic salt solution.

Next, the organometallic salt solution mixed with the first crystal particles 31 and the second crystal particles 32 is applied onto the first superconducting layer 16. Next, the applied organometallic salt solution is sintered in a state of being sandwiched between the first superconducting layer 16 and the second superconducting layer 26 to form the connection layer 30.

The third crystal particles 33 are formed by sintering the organometallic salt solution. The major diameter of the third crystal particles 33 is smaller than the major diameter of the first crystal particles 31. In addition, the major diameter of the third crystal particles 33 is smaller than the major diameter of the second crystal particles 32.

With the method described above, the first superconducting layer 16 and the second superconducting layer 26 are connected. With the above method, the connection structure 100 for a superconducting layer according to the first embodiment is formed.

The oxide superconductor can also be formed using, for example, an MOD method, a PLD method, or an MOCVD method instead of the solid phase reaction method.

Furthermore, the connection layer 30 can also be formed by, for example, a solid phase reaction method instead of the MOD method. In a case where the connection layer 30 is formed by a solid phase reaction method, a slurry in which powders of $Gd_2O_3$, $BaCO_3$, and CuO, the first crystal particles 31, and the second crystal particles 32 are mixed is prepared. The prepared slurry is heat-treated in a state of being sandwiched between the first superconducting layer 16 and the second superconducting layer 26 to form the connection layer 30. The powders of $Gd_2O_3$, $BaCO_3$, and CuO react to form the third crystal particles 33.

Next, functions and effects of the connection structure for a superconducting layer according to the first embodiment will be described.

A nuclear magnetic resonator (NMR) or a magnetic resonance imaging system (MRI) uses a superconducting coil to generate a strong magnetic field, for example. The superconducting coil is formed by winding a superconducting wire around a spool.

In order to increase the length of the superconducting wire, a plurality of superconducting wires is connected, for example. For example, ends of two superconducting wires are connected using a connection structure. The connection structure for connecting superconducting wires is required to have low electric resistance and high mechanical strength.

In the method for connecting superconducting layers according to the first embodiment, the connection layer 30 connecting the first superconducting layer 16 and the second superconducting layer 26 includes a first crystal particle 31 having a larger major diameter and a larger aspect ratio, a second crystal particle 32 having a major diameter and an aspect ratio which are smaller than those of the first crystal particle 31, and a third crystal particle 33 having a major diameter smaller than that of the second crystal particle 32. Since the connection layer includes the first crystal particle 31, the second crystal particle 32, and the third crystal particle 33, the connection structure 100 for superconducting layers having low electric resistance and high mechanical strength can be achieved. The details will be described below.

The connection structure 100 for a superconducting layer according to the first embodiment includes the first crystal particle 31 having a larger major diameter, so that the electrical resistance of the connection layer 30 is reduced. Due to the inclusion of the first crystal particle 31 having a larger major diameter, the crystal particle interface in the connection layer 30 is reduced. Therefore, an increase in electric resistance of the connection layer 30 due to the interface resistance at the crystal particle interface is suppressed.

In addition, in the connection structure 100 for a superconducting layer according to the first embodiment, the third crystal particle 33 having a smaller major diameter fills the space between the first crystal particle 31 having a larger major diameter and the second crystal particle 32 having a larger major diameter. The first crystal particle 31 and the second crystal particle 32 are connected by the third crystal particle 33, so that the mechanical strength of the connection layer 30 is improved.

Figure 6:
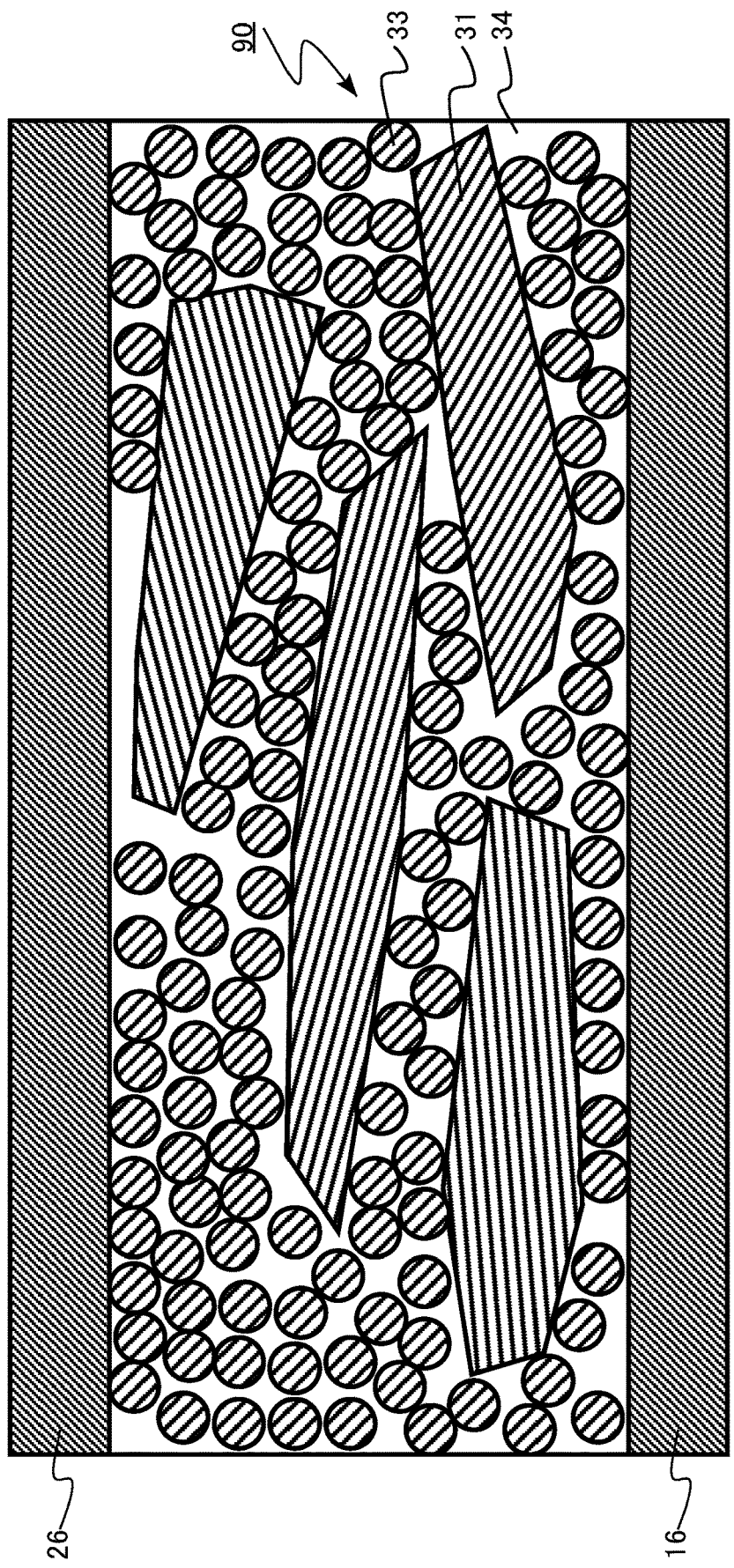
FIG. 6 is an enlarged schematic cross-sectional view of a part of a connection layer according to a comparative example.

FIG. 6 is an enlarged schematic cross-sectional view of a part of a connection layer according to a comparative example. A connection layer 90 according to the comparative example is different from the connection layer 30 according to the first embodiment in not containing the second crystal particle 32.

When crystal particles containing a rare earth element (RE), barium (Ba), copper (Cu), and oxygen (O) are formed by pulverizing an oxide superconductor, flat-shaped particles having a higher aspect ratio like the first crystal particles 31 are likely to be formed. Crystal particles containing a rare earth element (RE), barium (Ba), copper (Cu), and oxygen (O) have anisotropy in conductivity. The flat-shaped particles such as the first crystal particles 31 have high conductivity in the major axis direction and low conductivity in the minor axis direction.

When a solution or slurry containing the first crystal particles 31 is applied onto the first superconducting layer 16 to form the connection layer 90, the first crystal particles 31 are likely to be arrayed such that the major axes are parallel to the surface of the first superconducting layer 16. As a result, the first crystal particles 31 are likely to be arrayed in the connection layer 90 in a direction in which the major axes are parallel to the interface between the first superconducting layer 16 and the connection layer 90 as shown in FIG. 6.

In other words, a second inclination angle of the major axis direction of the first crystal particle 31 with respect to the interface between the first superconducting layer 16 and the connection layer 90 decreases. The second inclination angle is, for example, less than 15 degrees.

When the major axis direction of the first crystal particle 31 is parallel to the interface between the first superconducting layer 16 and the connection layer 90 as illustrated in FIG. 6, the current flowing through the connection layer 90 mainly flows in the minor axis direction of the first crystal particle 31. Therefore, the electric resistance of the connection layer 90 is increased.

In addition, when the major axis direction of the first crystal particle 31 is parallel to the interface between the first superconducting layer 16 and the connection layer 90, the ratio of the crystal particle interface in the path of the current flowing through the connection layer 90 increases. Therefore, the electric resistance of the connection layer 90 is increased.

The connection layer 30 according to the first embodiment includes the second crystal particles 32 having an aspect ratio smaller than that of the first crystal particles 31 and a major diameter larger than that of the third crystal particles 33. When a solution or slurry is applied onto the first superconducting layer 16 to form the connection layer 30, the solution or slurry contains the second crystal particles 32 in addition to the first crystal particles 31.

Since the solution or slurry contains the second crystal particles 32, the first crystal particles 31 are likely to be arrayed with the major axes inclined with respect to the surface of the first superconducting layer 16. As a result, the first crystal particles 31 are likely to be arrayed in a direction in which the major axes are inclined with respect to the interface between the first superconducting layer 16 and the connection layer 30 as shown in FIG. 2.

In other words, the first inclination angle between the major axis direction of the first crystal particle 31 and the interface between the first superconducting layer 16 and the connection layer 30 increases. The first inclination angle is, for example, equal to or more than 15 degrees and equal to or less than 90 degrees.

When the major axis direction of the first crystal particle 31 is inclined with respect to the interface between the first superconducting layer 16 and the connection layer 30, the current flowing through the connection layer 30 mainly flows in the major axis direction of the first crystal particle 31. Therefore, the electric resistance of the connection layer 30 is decreased.

In addition, when the major axis direction of the first crystal particle 31 is inclined with respect to the interface between the first superconducting layer 16 and the connection layer 30, the ratio of the crystal particle interface in the path of the current flowing through the connection layer 30 decreases. Therefore, the electric resistance of the connection layer 30 is decreased.

In the connection structure 100 for a superconducting layer according to the first embodiment, the connection layer 30 includes the second crystal particles 32, whereby the electric resistance is reduced.

As described above, the connection structure 100 for a superconducting layer according to the first embodiment can achieve low electric resistance and high mechanical strength.

From the viewpoint of reducing the electric resistance of the connection layer 30, the median value of the major diameters of the first crystal particles 31 is preferably equal to or more than 100 nm, more preferably equal to or more than 1 µm, and still more preferably equal to or more than 3 µm. From the viewpoint of reducing the electric resistance of the connection layer 30, the first major diameter d1 is preferably equal to or more than 100 nm, more preferably equal to or more than 1 µm, and still more preferably equal to or more than 3 µm.

From the viewpoint of reducing the electric resistance of the connection layer 30, the major diameter of the first crystal particle 31 is preferably greater than the thickness (t in FIG. 2) of the connection layer 30 in the direction from the first superconducting layer 16 toward the second superconducting layer 26.

From the viewpoint of reducing the electric resistance of the connection layer 30, it is preferable that the first median value of the major diameters of the crystal particles included in the distribution on the higher aspect ratio side in the bimodal distribution in the aspect ratio distribution of the crystal particles is greater than the thickness (t in FIG. 2) of the connection layer 30 in the direction from the first superconducting layer 16 toward the second superconducting layer 26.

From the viewpoint of reducing the electric resistance of the connection layer 30, the median value of the aspect ratios of the first crystal particles 31 is preferably equal to or more than 2, more preferably equal to or more than 4, and still more preferably equal to or more than 6. From the viewpoint of reducing the electric resistance of the connection layer 30, the median value of the aspect ratios of the crystal particles included in the distribution on the higher aspect ratio side in the bimodal distribution is preferably equal to or more than 2, more preferably equal to or more than 4, and still more preferably equal to or more than 6.

From the viewpoint of reducing the electric resistance of the connection layer 30, the median value of the first inclination angles between the major axis direction of the first crystal particles 31 and the interface between the first superconducting layer 16 and the connection layer 30 is preferably equal to or more than degrees, more preferably equal to or more than 20 degrees, and still more preferably equal to or more than 30 degrees.

From the viewpoint of reducing the electric resistance of the connection layer 30, it is preferable that the median value of first inclination angles which are defined as inclination angles between the major axis directions of the crystal particles included in the distribution on the higher aspect ratio side in the bimodal distribution and the interface between the first superconducting layer 16 and the connection layer 30 is preferably equal to or more than 15 degrees, more preferably equal to or more than 20 degrees, and still more preferably equal to or more than 30 degrees.

From the viewpoint of reducing the electric resistance of the connection layer 30, the median value of the major diameters of the second crystal particles 32 is preferably equal to or more than 50 nm, more preferably equal to or more than 1 μm, and still more preferably equal to or more than 3 μm. From the viewpoint of reducing the electric resistance of the connection layer 30, the second major diameter d2 is preferably equal to or more than 50 nm, more preferably equal to or more than 1 μm, and still more preferably equal to or more than 3 μm.

From the viewpoint of reducing the electric resistance of the connection layer 30, the median value of the major diameters of the second crystal particles 32 is preferably equal to or less than 5 μm. From the viewpoint of reducing the electric resistance of the connection layer 30, the second major diameter d2 is preferably equal to or less than 5 μm.

From the viewpoint of reducing the electric resistance of the connection layer 30, it is preferable that the second median value of the major diameters of the crystal particles included in the distribution on the lower aspect ratio side in the bimodal distribution is smaller than the thickness (t in FIG. 2) of the connection layer 30 in the direction from the first superconducting layer 16 toward the second superconducting layer 26.

From the viewpoint of reducing the electric resistance of the connection layer 30, the median value of the aspect ratios of the second crystal particles 32 is preferably less than 2, and more preferably less than 1.5. From the viewpoint of reducing the electric resistance of the connection layer 30, the median value of the aspect ratios of the crystal particles included in the distribution on the lower aspect ratio side in the bimodal distribution is preferably less than 2, and more preferably less than 1.5.

From the viewpoint of reducing the electric resistance of the connection layer 30, the number of the first crystal particles 31 is preferably equal to or more than 0.1 times and equal to or less than 1.1 times the number of the second crystal particles 32. From the viewpoint of reducing the electric resistance of the connection layer 30, the number of crystal particles included in the distribution on the higher aspect ratio side in the bimodal distribution is equal to or more than 0.1 times and equal to or less than 1.1 times the number of crystal particles included in the distribution on the lower aspect ratio side in the bimodal distribution.

From the viewpoint of increasing the mechanical strength of the connection layer 30, the median value of the major diameters of the third crystal particles 33 is preferably less than 1 μm, more preferably equal to or less than 500 nm, and still more preferably less than 200 nm. From the viewpoint of increasing the mechanical strength of the connection layer 30, the third major diameter d3 is preferably less than 1 μm, more preferably equal to or less than 500 nm, and still more preferably less than 200 nm.

From the viewpoint of increasing the mechanical strength of the connection layer 30, the median value of the major diameters of the first crystal particles 31 is preferably equal to or more than 10 times the major diameter of the third crystal particle 33. From the viewpoint of increasing the mechanical strength of the connection layer 30, the first major diameter d1 is preferably equal to or more than 10 times the third major diameter d3.

From the viewpoint of increasing the mechanical strength of the connection layer 30, the median value of the major diameters of the second crystal particles 32 is preferably equal to or more than 10 times the major diameter of the third crystal particle 33. From the viewpoint of increasing the mechanical strength of the connection layer 30, the second major diameter d2 is preferably equal to or more than 10 times the third major diameter d3.

From the viewpoint of increasing the mechanical strength of the connection layer 30, the chemical composition of the first crystal particle 31 and the chemical composition of the second crystal particle 32 are preferably the same. From the viewpoint of increasing the mechanical strength of the connection layer 30, the chemical composition of the first crystal particle 31 and the chemical composition of the third crystal particle 33 are preferably the same. From the viewpoint of increasing the mechanical strength of the connection layer 30, the chemical composition of the second crystal particle 32 and the chemical composition of the third crystal particle 33 are preferably the same.

As described above, the connection structure for a superconducting layer according to the first embodiment can achieve low electric resistance and high mechanical strength.

Second Embodiment

A superconducting wire according to the second embodiment includes a first superconducting wire including a first superconducting layer, a second superconducting wire including a second superconducting layer, a third superconducting layer having a first face and a second face facing the first face, and a connection layer provided between the first superconducting layer and the third superconducting layer and between the second superconducting layer and the third superconducting layer, the connection layer including crystal particles containing a rare earth element (RE), barium (Ba), copper (Cu), and oxygen (O), the crystal particles having a major diameter distribution including a trimodal distribution. The first superconducting layer and the second superconducting layer are located on the first face side of the third superconducting layer. The trimodal distribution has a first distribution including a first peak, a second distribution including a second peak, and a third distribution including a third peak, a first major diameter corresponding to the first peak is greater than a second major diameter corresponding to the second peak, and the second major diameter is greater than a third major diameter corresponding to the third peak. An aspect ratio distribution of the crystal particles included in the first distribution and the second distribution includes a bimodal distribution, and in the bimodal distribution, a first median value of major diameters of the crystal particles included in a distribution on a higher aspect ratio side is greater than a second median value of major diameters of the crystal particles included in a distribution on a lower aspect ratio side. The superconducting wire according to the second embodiment uses the connection structure for a superconducting layer according to the first embodiment as a structure for connecting the first superconducting wire and the second superconducting wire. In the following, the description overlapping with that of the first embodiment will be partially omitted.

Figure 7:
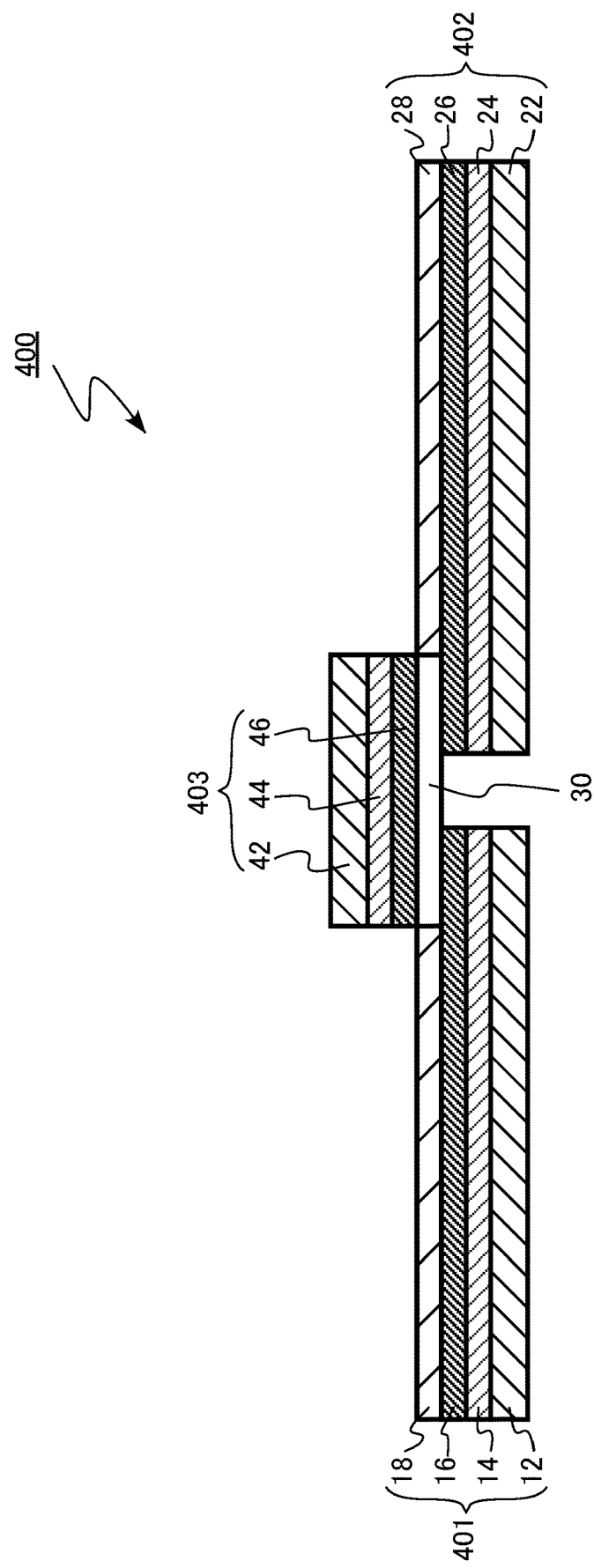
FIG. 7 is a schematic cross-sectional view of a superconducting wire according to a second embodiment.

FIG. 7 is a schematic cross-sectional view of a superconducting wire according to the second embodiment. The superconducting wire 400 according to the second embodiment includes a first superconducting wire 401, a second superconducting wire 402, and a connection member 403. The superconducting wire 400 according to the second embodiment is increased in length by connecting the first superconducting wire 401 and the second superconducting wire 402 using the connection member 403.

The first superconducting wire 401 includes a first substrate 12, a first intermediate layer 14, a first superconducting layer 16, and a first protective layer 18. The second superconducting wire 402 includes a second substrate 22, a second intermediate layer 24, a second superconducting layer 26, and a second protective layer 28. The connection member 403 includes a third substrate 42, a third intermediate layer 44, and a third superconducting layer 46.

The first superconducting wire 401, the second superconducting wire 402, and the connection member 403 have a structure similar to the structures of the first superconducting member 10 and the second superconducting member 20 in the first embodiment.

The connection layer 30 is provided between the first superconducting layer 16 and the third superconducting layer 46. The connection layer 30 is in contact with the first superconducting layer 16. The connection layer 30 is in contact with the third superconducting layer 46.

The connection layer 30 is provided between the second superconducting layer 26 and the third superconducting layer 46. The connection layer 30 is in contact with the second superconducting layer 26. The connection layer 30 is in contact with the third superconducting layer 46.

The first superconducting layer 16 and the second superconducting layer 26 are located on a side of the first face of the third superconducting layer 46. The connection layer 30 between the first superconducting layer 16 and the third superconducting layer 46 and the connection layer 30 between the second superconducting layer 26 and the third superconducting layer 46 are continuous.

The connection layer 30 is not present between, for example, the first superconducting layer 16 and the second superconducting layer 26. The gap between the first superconducting layer 16 and the second superconducting layer 26 is, for example, an air gap.

The connection layer 30 is an oxide superconducting layer. The connection layer 30 contains, for example, a rare earth element (RE), barium (Ba), copper (Cu), and oxygen (O). The connection layer 30 contains, for example, at least one rare earth element (RE) selected from the group including yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

The connection layer 30 in the second embodiment has a configuration similar to the configuration of the connection layer 30 in the first embodiment illustrated in FIG. 2.

In the superconducting wire 400 according to the second embodiment, a current flows, for example, from the first superconducting wire 401 to the second superconducting wire 402 through the connection layer 30, the connection member 403, and the connection layer 30.

Since the first superconducting wire 401 and the connection member 403 are connected using the connection layer 30, the connection structure for connecting the first superconducting wire 401 and the connection member 403 has low electric resistance and high mechanical strength. In addition, since the second superconducting wire 402 and the connection member 403 are connected using the connection layer 30, the connection structure for connecting the second superconducting wire 402 and the connection member 403 has low electric resistance and high mechanical strength.

Therefore, the connection structure for connecting the first superconducting wire 401 and the second superconducting wire 402 has low electric resistance and high mechanical strength. Accordingly, the superconducting wire 400 has low electric resistance and high mechanical strength.

It is also possible to connect three or more superconducting wires to form a further increased superconducting wire in length.

First Modification

Figure 8:
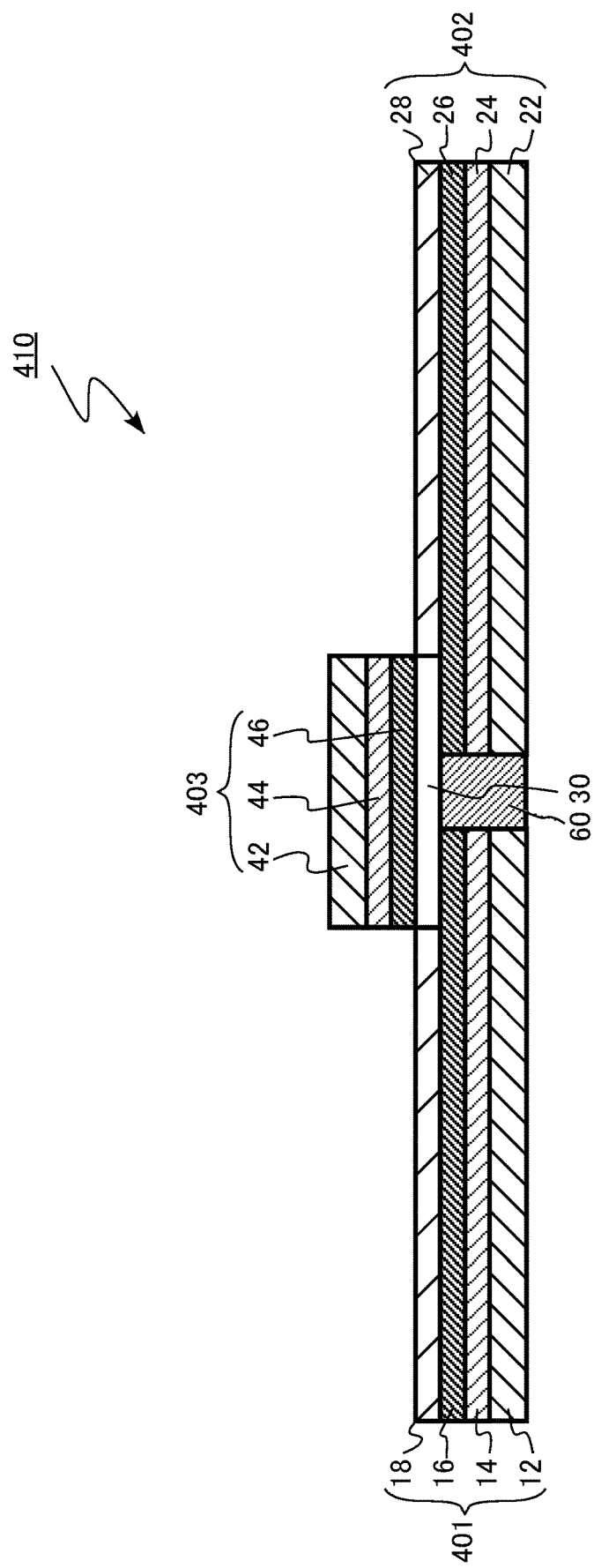
FIG. 8 is a schematic cross-sectional view of a first modification of the superconducting wire according to the second embodiment.

FIG. 8 is a schematic cross-sectional view of a first modification of the superconducting wire according to the second embodiment. A superconducting wire 410 according to the first modification of the second embodiment is different from the superconducting wire 400 according to the second embodiment in including a reinforcing member 60.

The reinforcing member 60 is provided between the first superconducting wire 401 and the second superconducting wire 402. The reinforcing member 60 is provided, for example, between the first superconducting layer 16 and the second superconducting layer 26.

The reinforcing member 60 is in contact with the first superconducting wire 401 and the second superconducting wire 402, for example. The reinforcing member 60 is in contact with the connection layer 30, for example.

Due to the reinforcing member 60, the mechanical strength of the superconducting wire 410 is increased.

The reinforcing member 60 is made of, for example, metal or resin. The reinforcing member 60 is made of, for example, a solder. The reinforcing member 60 is made of, for example, a solder containing silver (Ag) and indium (In).

Second Modification

Figure 9:
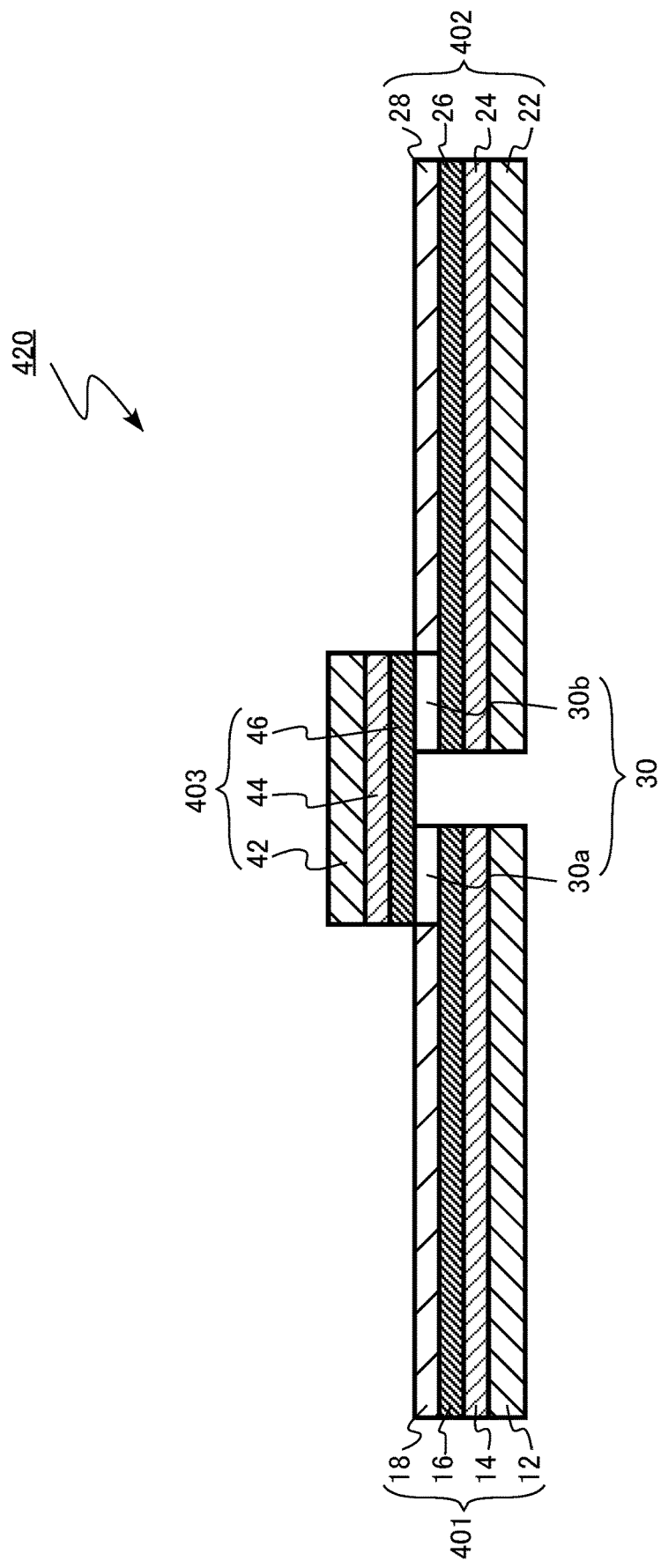
FIG. 9 is a schematic cross-sectional view of a second modification of the superconducting wire according to the second embodiment.

FIG. 9 is a schematic cross-sectional view of a second modification of the superconducting wire according to the second embodiment. A superconducting wire 420 according to the second modification of the second embodiment is different from the superconducting wire 400 according to the second embodiment in that a connection layer 30 includes a first region 30a and a second region 30b spaced from each other.

The connection layer 30 includes the first region 30a and the second region 30b. The first region 30a and the second region 30b are separated from each other.

The first region 30a is provided between the first superconducting layer 16 and the third superconducting layer 46. The first region 30a is in contact with the first superconducting layer 16. The first region 30a is in contact with the third superconducting layer 46.

The second region 30b is provided between the second superconducting layer 26 and the third superconducting layer 46. The second region 30b is in contact with the second superconducting layer 26. The second region 30b is in contact with the third superconducting layer 46.

Third Modification

Figure 10:
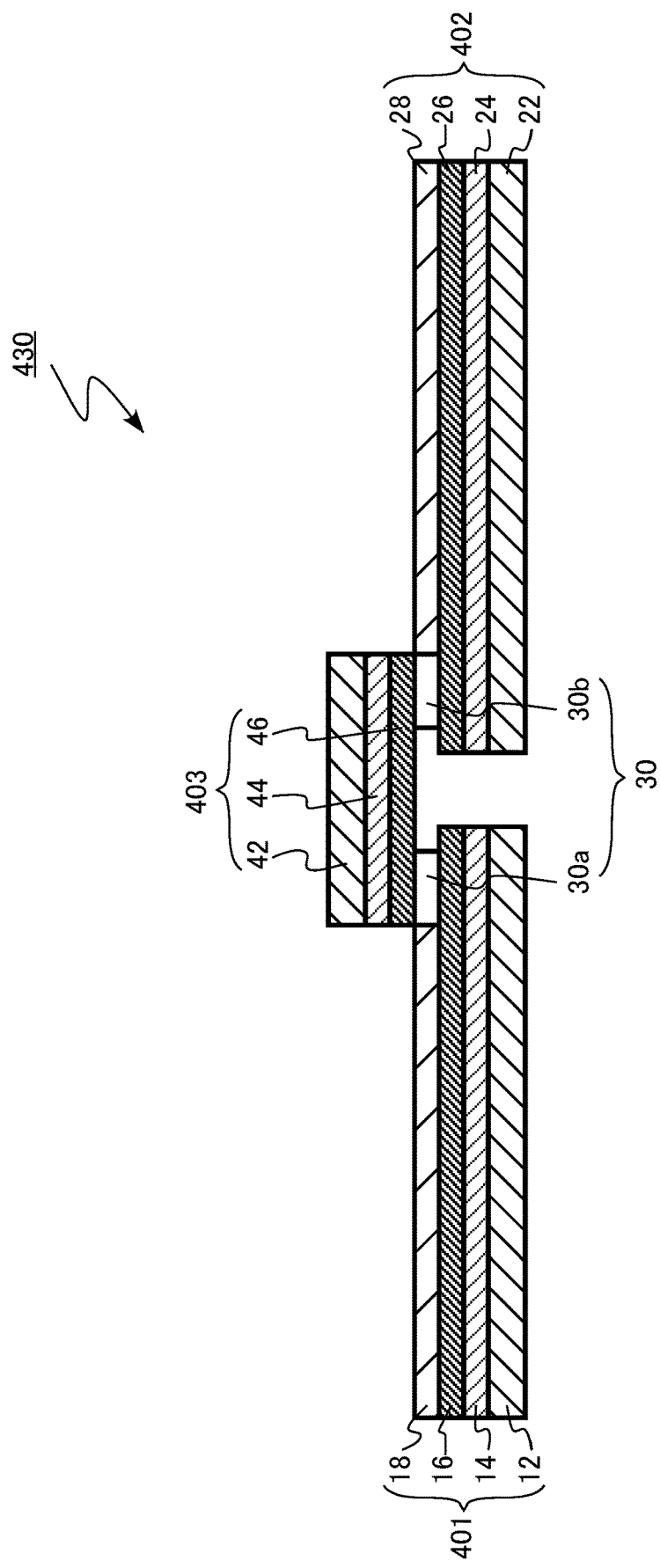
FIG. 10 is a schematic cross-sectional view of a third modification of the superconducting wire according to the second embodiment.

FIG. 10 is a schematic cross-sectional view of a third modification of the superconducting wire according to the second embodiment. A superconducting wire 430 according to the third modification of the second embodiment is different from the superconducting wire 420 according to the second modification of the second embodiment in that a part of a surface of the first superconducting layer 16 facing the third superconducting layer 46 is exposed and a part of a surface of the second superconducting layer 26 facing the third superconducting layer 46 is exposed.

There is a region where the connection layer 30 is not present in the vicinity of the end portion on the second superconducting layer 26 side of the upper surface of the first superconducting layer 16. In addition, there is a region where the connection layer 30 is not present in the vicinity of the end portion on the first superconducting layer 16 side of the upper surface of the second superconducting layer 26.

Fourth Modification

Figure 11:
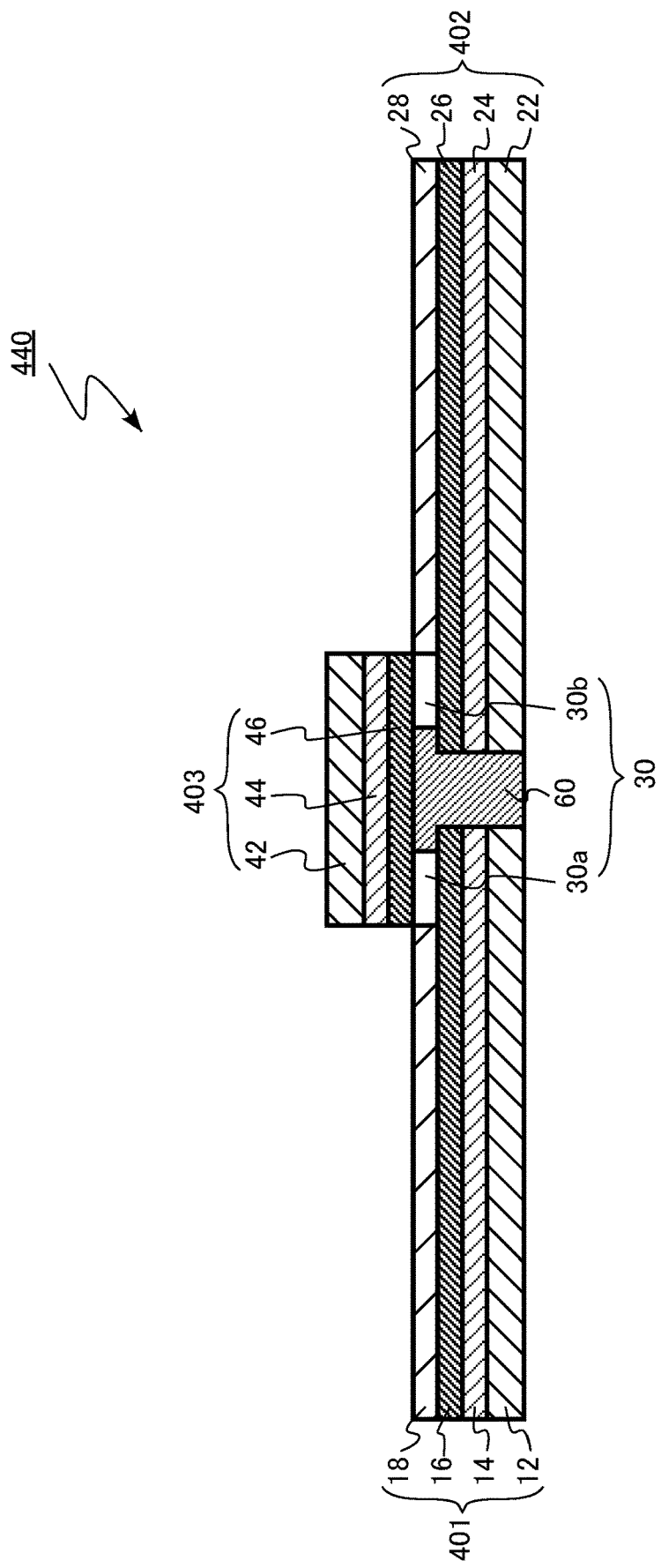
FIG. 11 is a schematic cross-sectional view of a fourth modification of the superconducting wire according to the second embodiment.

FIG. 11 is a schematic cross-sectional view of a fourth modification of the superconducting wire according to the second embodiment. A superconducting wire 440 according to the fourth modification of the second embodiment is different from the superconducting wire 430 according to the third modification of the second embodiment in including a reinforcing member 60.

The reinforcing member 60 is provided between the first superconducting wire 401 and the second superconducting wire 402. The reinforcing member 60 is provided, for example, between the first superconducting layer 16 and the second superconducting layer 26. The reinforcing member 60 is provided, for example, between the first superconducting layer 16 and the third superconducting layer 46. The reinforcing member 60 is provided, for example, between the second superconducting layer 26 and the third superconducting layer 46. The reinforcing member 60 is provided, for example, between the first region 30a and the second region 30b.

Due to the reinforcing member 60, the mechanical strength of the superconducting wire 440 is increased.

The reinforcing member 60 is made of, for example, metal or resin. The reinforcing member 60 is made of, for example, a solder. The reinforcing member 60 is made of, for example, a solder containing silver (Ag) and indium (In).

As described above, according to the second embodiment and the modifications, it is possible to achieve a superconducting wire that has low electric resistance and high mechanical strength and that is increased in length by connecting two superconducting wires.

Third Embodiment

The third embodiment describes a superconducting coil provided with the superconducting wire according to the second embodiment. In the following, the description overlapping with that of the second embodiment may be partially omitted.

Figure 12:
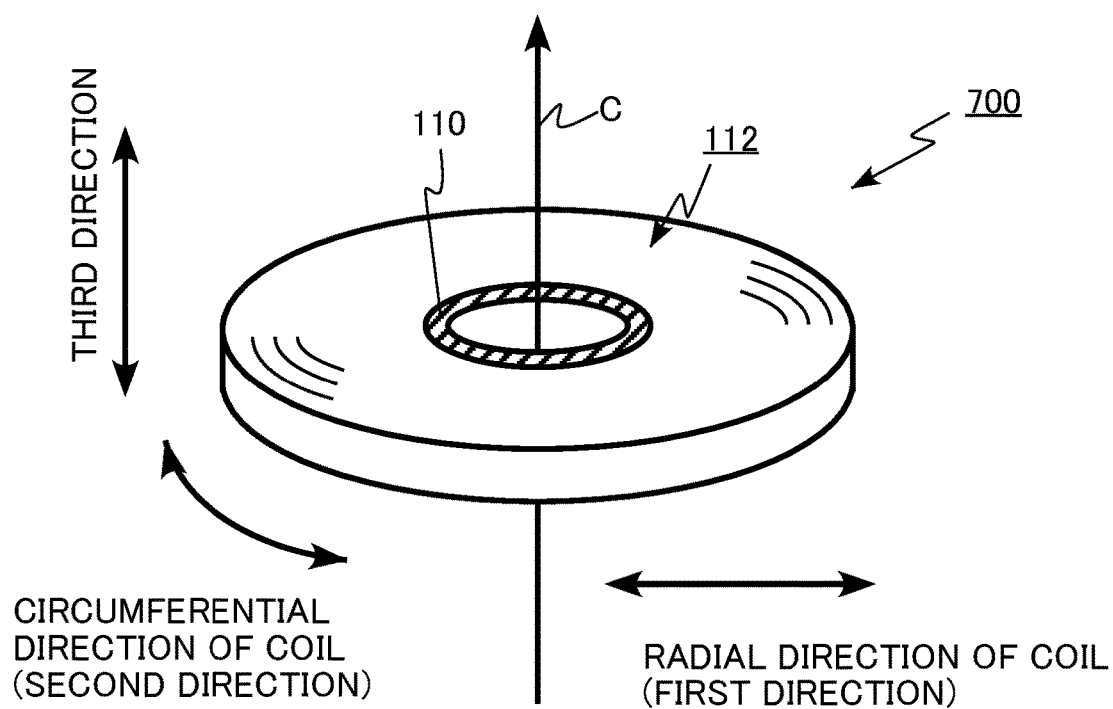
FIG. 12 is a schematic perspective view of a superconducting coil according to a third embodiment.
Figure 13:
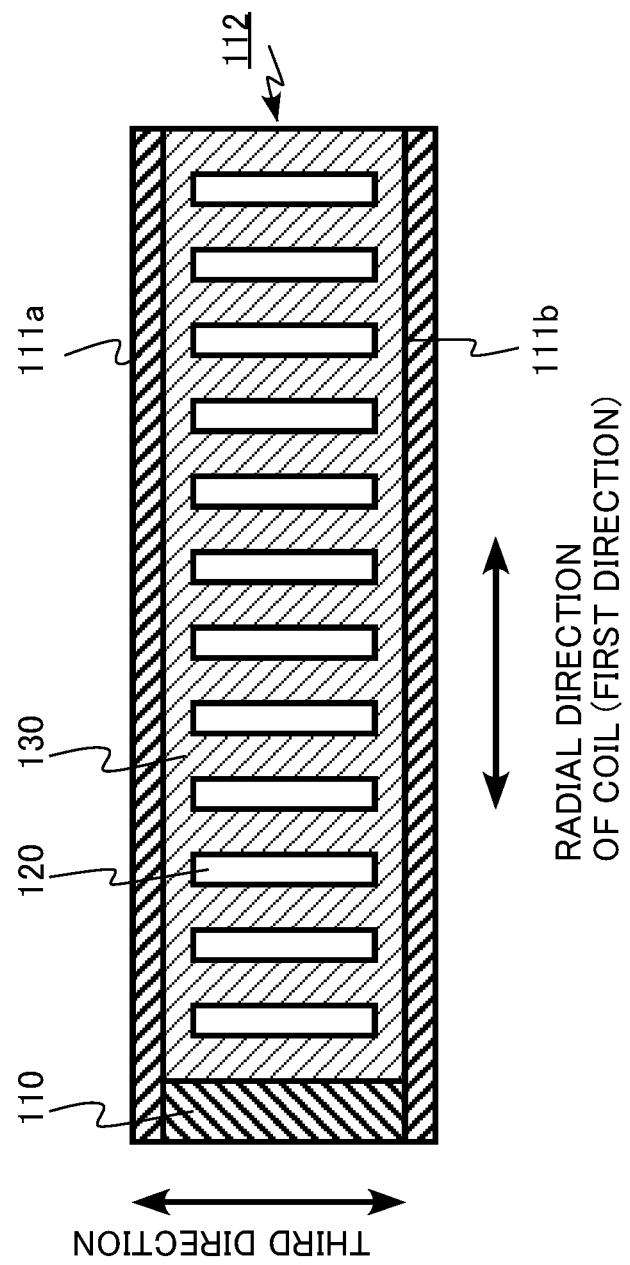
FIG. 13 is a schematic cross-sectional view of the superconducting coil according to the third embodiment.

FIG. 12 is a schematic perspective view of the superconducting coil according to the third embodiment. FIG. 13 is a schematic cross-sectional view of the superconducting coil according to the third embodiment.

The superconducting coil 700 according to the third embodiment is used as a coil for generating a magnetic field of a superconducting device such as an NMR, an MRI, a heavy particle radiotherapy device, or a superconducting maglev.

The superconducting coil 700 includes a spool 110, a first insulating plate 111a, a second insulating plate 1/1b, and a winding portion 112. The winding portion 112 includes a superconducting wire 120 and an inter-wire layer 130.

FIG. 13 illustrates a state in which the first insulating plate 111a and the second insulating plate 111b are removed.

The spool 110 is made of, for example, fiber-reinforced plastic. The superconducting wire 120 has, for example, a tape shape. As illustrated in FIG. 13, the superconducting wire 120 is wound around the spool 110 in a concentric so-called pancake shape around the winding center C.

The inter-wire layer 130 has a function of fixing the superconducting wire 120. The inter-wire layer 130 has a function of preventing the superconducting wire 120 from being damaged by vibration or mutual friction during use of the superconducting device.

The first insulating plate 111a and the second insulating plate 111b are made of, for example, fiber-reinforced plastic. The first insulating plate 111a and the second insulating plate 111b have a function of insulating the winding portion 112 from the outside. The winding portion 112 is located between the first insulating plate 111a and the second insulating plate 111b.

The superconducting wire according to the second embodiment is used for the superconducting wire 120.

As described above, according to the third embodiment, the superconducting coil includes the superconducting wire having low electric resistance and high mechanical strength, whereby the improvement in characteristics of the superconducting coil can be achieved.

Fourth Embodiment

The fourth embodiment describes a superconducting device provided with the superconducting coil according to the third embodiment. In the following, the description overlapping with that of the third embodiment will be partially omitted.

Figure 14:
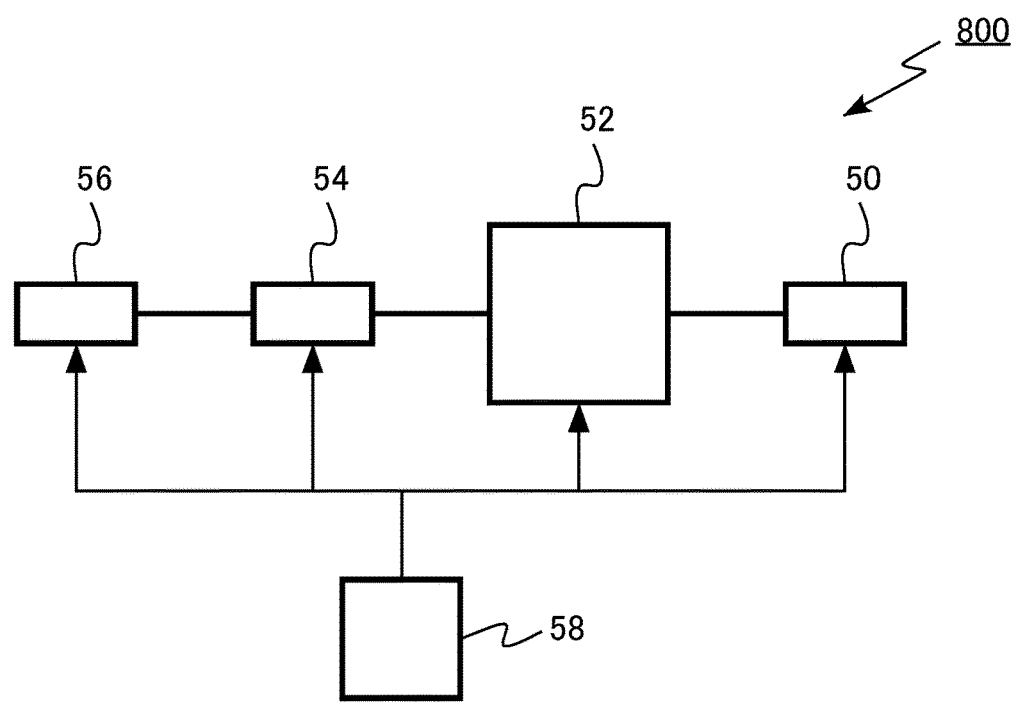
FIG. 14 is a block diagram of a superconducting device according to a fourth embodiment.

FIG. 14 is a block diagram of the superconducting device according to the fourth embodiment. The superconducting device according to the fourth embodiment is a heavy particle radiotherapy device 800. The heavy particle radiotherapy device 800 is an example of the superconducting device.

The heavy particle radiotherapy device 800 includes an incidence system 50, a synchrotron accelerator 52, a beam transport system 54, an irradiation system 56, and a control system 58.

The incidence system 50 has a function of generating carbon ions for use in treatment and preliminarily accelerating the carbon ions to be incident on the synchrotron accelerator 52, for example. The incidence system 50 includes, for example, an ion generation source and a linear accelerator.

The synchrotron accelerator 52 has a function of accelerating the carbon ion beam incident from the incidence system 50 to energy appropriate to treatment. The superconducting coil 700 according to the third embodiment is used for the synchrotron accelerator 52.

The beam transport system 54 has a function of transporting the carbon ion beam incident from the synchrotron accelerator 52 to the irradiation system 56. The beam transport system 54 includes, for example, a bending electromagnet.

The irradiation system 56 has a function of irradiating a patient to be irradiated with the carbon ion beam incident from the beam transport system 54. The irradiation system 56 has, for example, a rotating gantry that enables irradiation of the carbon ion beam from any direction. The superconducting coil 700 according to the third embodiment is used for the rotating gantry.

The control system 58 controls the incidence system 50, the synchrotron accelerator 52, the beam transport system 54, and the irradiation system 56. The control system 58 is, for example, a computer.

In the heavy particle radiotherapy device 800 according to the fourth embodiment, the superconducting coil 700 according to the third embodiment is used for the synchrotron accelerator 52 and the rotating gantry. Therefore, the heavy particle radiotherapy device 800 having excellent characteristics is achieved.

The fourth embodiment has described the heavy particle radiotherapy device 800 as an example of the superconducting device. However, the superconducting device may be a nuclear magnetic resonator (NMR), a magnetic resonance imaging system (MRI), or a superconducting maglev.

EXAMPLES

Example 1

Two 10.5 cm-long oxide superconducting wires were prepared, each wire having an intermediate layer and a $GdBa_2Cu_3O_{7-\delta}$ layer (oxide superconducting layer) formed on a Hastelloy substrate and covered with a protective layer made of silver and copper. A portion of 1.0 cm from one end of each wire was wet etched using a mixed solution of nitric acid, ammonia, and hydrogen peroxide to expose the oxide superconducting layer.

Powders of $Gd_2O_3$, $BaCO_3$, and CuO were prepared, weighed appropriately, then mixed sufficiently. The mixed powder was compression molded to prepare a green compact. The obtained green compact was sintered at 930° C., by which an oxide superconductor having a composition of $GdBa_2Cu_3O_{7-\delta}$ was manufactured. The obtained oxide superconductor was hit and pulverized on a mortar, and particles having a suitable diameter were selected with a sieve or the like. Thus, superconductor powders having a high aspect ratio in which the median value of major diameters was equal to or more than 5 µm and the median value of minor diameters was equal to or less than 2 µm were manufactured.

The smaller particles obtained during the selection were further pulverized for three hours or more using a ball mill to prepare superconductor powders having a median value of particle diameters of 3 µm or more and an aspect ratio of less than 2.

The obtained two kinds of superconductor powders and an organometallic salt solution obtained by dissolving $Gd(OCOCH_3)_2$, $Ba(OCOCH_3)_2$, and $Cu(OCOCH_3)_2$ were mixed at a weight ratio of 1:1:4 to prepare a slurry.

The obtained slurry was applied to the exposed oxide superconducting layer of one of the superconducting wires. Thereafter, the portion of the superconducting wire coated with the slurry and the portion of the other superconducting wire from which the superconducting layer was exposed were superposed to face each other.

The superposed wires were vertically sandwiched between jigs, and pressed.

The wires were subjected to a first heat treatment for heating the wires to 780° C. in the air atmosphere while being sandwiched between the jigs. Thereafter, the resultant was cooled to around room temperature, and subjected to a second heat treatment for heating the resultant to 500° C. in an oxygen atmosphere which was formed by introducing oxygen gas into a furnace. Thus, a connection structure for connecting the superconducting wires was manufactured.

Terminals were attached to both ends of the connected superconducting wire, and the temperature dependence of electric resistance was measured. As a result, a clear superconducting transition was confirmed at around 93 K and a transition width of about 1 K. The following Examples and Comparative Examples show relative critical current values with the critical current value of the connection structure in Example 1 after the superconducting transition being used as a reference value 1.0.

Comparative Example 1

Two 10.5 cm-long oxide superconducting wires were prepared, each wire having an intermediate layer and a $GdBa_2Cu_3O_{7-\delta}$ layer (oxide superconducting layer) formed on a Hastelloy substrate and covered with a protective layer made of silver and copper. A portion of 1.0 cm from one end of each wire was wet etched using a mixed solution of nitric acid, ammonia, and hydrogen peroxide to expose the oxide superconducting layer.

Powders of $Gd_2O_3$, $BaCO_3$, and CuO were prepared, weighed appropriately, then mixed sufficiently. The mixed powder was compression molded to prepare a green compact. The obtained green compact was sintered at 930° C., by which an oxide superconductor having a composition of $GdBa_2Cu_3O_{7-\delta}$ was manufactured. The obtained oxide superconductor was hit and pulverized on a mortar, and particles having a suitable diameter were selected with a sieve or the like. Thus, superconductor powders having a high aspect ratio in which the median value of major diameters was equal to or more than 5 µm and the median value of minor diameters was equal to or less than 2 µm were manufactured.

The obtained superconductor powders, $Gd_2O_3$ powders having a particle size of about 50 nm, $BaCO_3$ powders having a particle size of about 70 nm, and CuO powders having a particle size of about 30 nm were mixed using a mortar. Water and sodium alginate were added to the obtained mixed powders to prepare a slurry.

The obtained slurry was applied to the exposed oxide superconducting layer of one of the superconducting wires. Thereafter, the portion of the superconducting wire coated with the slurry and the portion of the other superconducting wire from which the superconducting layer was exposed were superposed to face each other.

The superposed wires were vertically sandwiched between jigs, and pressed.

The wires were subjected to a first heat treatment for heating the wires to 780° C. in the air atmosphere while being sandwiched between the jigs. Thereafter, the resultant was cooled to around room temperature, and subjected to a second heat treatment for heating the resultant to 500° C. in an oxygen atmosphere which was formed by introducing oxygen gas into a furnace. Thus, a connection structure for connecting the superconducting wires was manufactured.

Terminals were attached to both ends of the connected superconducting wire, and the temperature dependence of electric resistance was measured. As a result, a clear superconducting transition was confirmed at around 93 K and a transition width of about 1 K. The critical current value after the superconducting transition was 0.8.

Example 2

Three oxide superconducting wires were prepared, each wire having an intermediate layer and a $GdBa_2Cu_3O_{7-\delta}$ layer (oxide superconducting layer) formed on a Hastelloy substrate and covered with a protective layer made of silver and copper. The length of one of the wires was 2.2 cm, and the length of each of the remaining two wires was 10 cm. A region between both ends of the 2.2-cm wire and a portion of 1.0 cm from one end of each of two 10-cm wires were wet etched using a mixed solution of nitric acid, ammonia, and hydrogen peroxide to expose the oxide superconducting layers.

Powders of $Gd_2O_3$, $BaCO_3$, and CuO were prepared, weighed appropriately, then mixed sufficiently. The mixed powder was compression molded to prepare a green compact. The obtained green compact was sintered at 930° C., by which an oxide superconductor having a composition of $GdBa_2Cu_3O_{7-\delta}$ was manufactured. The obtained oxide superconductor was hit and pulverized on a mortar, and particles having a suitable diameter were selected with a sieve or the like. Thus, superconductor powders having a high aspect ratio in which the median value of major diameters was equal to or more than 5 μm and the median value of minor diameters was equal to or less than 2 μm were manufactured.

The smaller particles obtained during the selection were further pulverized for three hours or more using a ball mill to prepare superconductor powders having a median value of particle diameters of 3 μm or more and an aspect ratio of less than 2.

The obtained two kinds of superconductor powders and an organometallic salt solution obtained by dissolving $Gd(OCOCH_3)_2$, $Ba(OCOCH_3)_2$, and $Cu(OCOCH_3)_2$ were mixed at a weight ratio of 1:1:4 to prepare a slurry.

The obtained slurry was applied to the exposed oxide superconducting layer of the superconducting wire with a length of 2.2 cm. Thereafter, the portion of the 2.2-cm superconducting wire coated with the slurry and the portion of the two 10-cm superconducting wires from which the superconducting layers were exposed were superposed to face each other in order to obtain the structure illustrated in FIG. 7.

The superposed wires were vertically sandwiched between jigs, and pressed.

The wires were subjected to a first heat treatment for heating the wires to 780° C. in the air atmosphere while being sandwiched between the jigs. Thereafter, the resultant was cooled to around room temperature, and subjected to a second heat treatment for heating the resultant to 500° C. in an oxygen atmosphere which was formed by introducing oxygen gas into a furnace. Thus, a connection structure for connecting the superconducting wires was manufactured.

Terminals were attached to both ends of the connected superconducting wire, and the temperature dependence of electric resistance was measured. As a result, a clear superconducting transition was confirmed at around 93 K and a transition width of about 1 K. The critical current value after the superconducting transition was 1.0.

First Modification

After a connection structure was formed according to the procedure of Example 2, a solder containing silver and indium was placed on the surface of the connection structure where the 10-cm superconducting wires faced each other, and the solder was melted and bonded by heating at 200° C. to obtain a reinforcing member.

Terminals were attached to both ends of the connected superconducting wire, and the temperature dependence of electric resistance was measured. As a result, a clear superconducting transition was confirmed at around 93 K and a transition width of about 1 K. The critical current value after the superconducting transition was 1.0.

Second Modification

Superconducting wires and a slurry were prepared according to the procedure of Example 2. The slurry was applied to a portion of the two 10-cm superconducting wires where superconducting layers were exposed, and the 2.2-cm superconducting wire and the portion of the two 10-cm superconducting wires where the slurry was applied were superposed so as to face each other.

The resultant was vertically sandwiched between jigs and pressed, and with this state, a heat treatment similar to the heat treatment in Example 2 was performed. Thus, a connection structure for connecting superconducting wires was formed, and measurement was performed.

A clear superconducting transition was confirmed at around 93 K and a transition width of about 1 K. The critical current value after the superconducting transition was 1.0.

Third Modification

Superconducting wires and a slurry were prepared according to the procedure of Example 2, and the slurry was applied to regions of 0.9 cm from both ends of the exposed oxide superconducting layer of the 2.2-cm superconducting wire. Thereafter, the portion of the 2.2-cm superconducting wire coated with the slurry and the portions of the 10-cm superconducting wires from which the superconducting layers were exposed were superposed to face each other in order to obtain the structure illustrated in FIG. 10.

The superposed wires were vertically sandwiched between jigs and pressed, and with this state, a heat treatment similar to the heat treatment in Example 2 was performed. Thus, a connection structure for connecting superconducting wires was formed, and measurement was performed.

A clear superconducting transition was confirmed at around 93 K and a transition width of about 1 K. The critical current value after the superconducting transition was 1.0.

Fourth Modification

After a connection structure was formed according to the procedure of the third modification, a solder containing silver and indium was placed on the surface of the connection structure where the 10-cm superconducting wires faced each other, and the solder was melted and bonded by heating at 200° C. to obtain a reinforcing member.

Terminals were attached to both ends of the connected superconducting wire, and the temperature dependence of electric resistance was measured. As a result, a clear superconducting transition was confirmed at around 93 K and a transition width of about 1 K. The critical current value after the superconducting transition was 1.0.

While certain embodiments have been described, these embodiments have been presented by way of example only, and are not intended to limit the scope of the inventions. Indeed, a connection structure for a superconducting layer, a superconducting wire, a superconducting coil, and a superconducting device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A connection structure for a superconducting layer, the connection structure comprising:
    a first superconducting layer;
    a second superconducting layer; and
    a connection layer provided between the first superconducting layer and the second superconducting layer, the connection layer including crystal particles containing a rare earth element (RE), barium (Ba), copper (Cu), and oxygen (O), the crystal particles having a major diameter distribution including a trimodal distribution, wherein
    the trimodal distribution includes a first distribution having a first peak, a second distribution having a second peak, and a third distribution having a third peak,
    a first major diameter corresponding to the first peak is greater than a second major diameter corresponding to the second peak, the second major diameter is greater than a third major diameter corresponding to the third peak,
    an aspect ratio distribution of the crystal particles included in the first distribution and the second distribution includes a bimodal distribution, and
    in the bimodal distribution, a first median value of major diameters of the crystal particles included in a distribution on a higher aspect ratio side is greater than a second median value of major diameters of the crystal particles included in a distribution on a lower aspect ratio side.

2. The connection structure for a superconducting layer according to claim 1, wherein
    the first median value is greater than a thickness of the connection layer in a direction from the first superconducting layer toward the second superconducting layer, and
    the second median value is smaller than the thickness of the connection layer.

3. The connection structure for a superconducting layer according to claim 1, wherein
    a median value of aspect ratios of the crystal particles included in the distribution on the higher aspect ratio side in the bimodal distribution is equal to or more than 2, and
    a median value of aspect ratios of the crystal particles included in the distribution on the lower aspect ratio side in the bimodal distribution is less than 2.

4. The connection structure for a superconducting layer according to claim 1, wherein
    a number of the crystal particles included in the distribution on the higher aspect ratio side in the bimodal distribution is equal to or more than 0.1 times and equal to or less than 1.1 times a number of the crystal particles included in the distribution on the lower aspect ratio side in the bimodal distribution.

5. The connection structure for a superconducting layer according to claim 1, wherein the first major diameter is equal to or more than 100 nm and equal to or less than 10 μm.

6. The connection structure for a superconducting layer according to claim 1, wherein the crystal particles included in the distribution on the higher aspect ratio side in the bimodal distribution include a sheet-shaped crystal particle or a flat-shaped crystal particle.

7. The connection structure for a superconducting layer according to claim 1, wherein a median value of first inclination angles between major axis directions of the crystal particles included in the distribution on the higher aspect ratio side in the bimodal distribution and an interface between the first superconducting layer and the connection layer is equal to or more than 15 degrees.

8. A superconducting wire comprising:
    a first superconducting wire including a first superconducting layer;
    a second superconducting wire including a second superconducting layer;
    a third superconducting layer having a first face and a second face facing the first face; and
    a connection layer provided between the first superconducting layer and the third superconducting layer and between the second superconducting layer and the third superconducting layer, the connection layer including crystal particles containing a rare earth element (RE), barium (Ba), copper (Cu), and oxygen (O), the crystal particles having a major diameter distribution including a trimodal distribution, wherein
    the first superconducting layer and the second superconducting layer are located on a side of the first face of the third superconducting layer,
    the trimodal distribution includes a first distribution having a first peak, a second distribution having a second peak, and a third distribution having a third peak,
    a first major diameter corresponding to the first peak is greater than a second major diameter corresponding to the second peak, the second major diameter is greater than a third major diameter corresponding to the third peak,
    an aspect ratio distribution of the crystal particles included in the first distribution and the second distribution includes a bimodal distribution, and
    in the bimodal distribution, a first median value of major diameters of the crystal particles included in a distribution on a higher aspect ratio side is greater than a second median value of major diameters of the crystal particles included in a distribution on a lower aspect ratio side.

9. The superconducting wire according to claim 8, wherein
    the first median value is greater than a thickness of the connection layer in a direction from the first superconducting layer toward the third superconducting layer, and
    the second median value is smaller than the thickness of the connection layer.

10. The superconducting wire according to claim 8, wherein
    a median value of aspect ratios of the crystal particles included in the distribution on the higher aspect ratio side in the bimodal distribution is equal to or more than 2, and
    a median value of aspect ratios of the crystal particles included in the distribution on the lower aspect ratio side is less than 2.

11. The superconducting wire according to claim 8, wherein
    a number of the crystal particles included in the distribution on the higher aspect ratio side in the bimodal distribution is equal to or more than 0.1 times and equal to or less than 1.1 times a number of the crystal particles included in the distribution on the lower aspect ratio side in the bimodal distribution.

12. The superconducting wire according to claim 8, wherein the first major diameter is equal to or more than 100 nm and equal to or less than 10 μm.

13. The superconducting wire according to claim 8, wherein the crystal particles included in the distribution on the higher aspect ratio side in the bimodal distribution include a sheet-shaped crystal particle or a flat-shaped crystal particle.

14. The superconducting wire according to claim 8, wherein a median value of first inclination angles between major axis directions of the crystal particles included in the distribution on the higher aspect ratio side in the bimodal distribution and an interface between the first superconducting layer and the connection layer is equal to or more than 15 degrees.

15. The superconducting wire according to claim 8, wherein the connection layer is not present between the first superconducting wire and the second superconducting wire.

16. The superconducting wire according to claim 8, wherein the connection layer between the first superconducting layer and the third superconducting layer and the connection layer between the second superconducting layer and the third superconducting layer are continuous.

17. A superconducting coil comprising the superconducting wire according to claim 8.

18. A superconducting device comprising the superconducting coil according to claim 17.

\* \* \* \* \*